(12) United States Patent
Park

(10) Patent No.: US 11,005,462 B1
(45) Date of Patent: May 11, 2021

(54) INTERFACE CIRCUIT AND INTERFACE DEVICE

(71) Applicant: SAMSUNG ELECTRONICS CO., LTD., Suwon-si (KR)

(72) Inventor: Jongmin Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/927,586

(22) Filed: Jul. 13, 2020

(30) Foreign Application Priority Data

Jan. 3, 2020 (KR) .................. 10-2020-0000863

(51) Int. Cl.
   *H03K 5/12* (2006.01)
   *H03K 19/0175* (2006.01)
   *H03K 5/1252* (2006.01)

(52) U.S. Cl.
   CPC ............ *H03K 5/12* (2013.01); *H03K 5/1252* (2013.01); *H03K 19/017509* (2013.01)

(58) Field of Classification Search
   CPC .... H03K 5/12; H03K 5/1252; H03K 19/0175; H03K 19/017509
   USPC .................... 326/62; 327/170, 333
   See application file for complete search history.

(56) References Cited

U.S. PATENT DOCUMENTS

| 5,537,067 | A | 7/1996 | Carvajal et al. | |
|---|---|---|---|---|
| 7,652,534 | B1* | 1/2010 | Lin | H03F 3/45219 330/255 |
| 7,652,538 | B2 | 1/2010 | Choi | |
| 7,876,129 | B2 | 1/2011 | Lu et al. | |
| 7,924,066 | B2 | 4/2011 | Gagne et al. | |
| 8,040,165 | B2* | 10/2011 | Azetsuji | H03K 19/00361 327/112 |
| 9,473,127 | B1* | 10/2016 | Azin | H03K 19/018507 |
| 9,496,834 | B2* | 11/2016 | Shimomaki | G09G 3/3696 |
| 10,516,389 | B2* | 12/2019 | Park | G11C 7/1057 |
| 10,826,466 | B1* | 11/2020 | Calcagno | H03K 5/04 |
| 2002/0079923 | A1 | 6/2002 | Tinsley et al. | |
| 2006/0125759 | A1* | 6/2006 | An | G09G 3/3688 345/98 |
| 2006/0217079 | A1 | 9/2006 | Yu et al. | |
| 2007/0057705 | A1* | 3/2007 | Kanzaki | H03K 17/04206 327/112 |
| 2007/0285412 | A1* | 12/2007 | Yoon-Kyung | G09G 3/3688 345/211 |
| 2008/0218292 | A1 | 9/2008 | Park et al. | |
| 2009/0075607 | A1 | 3/2009 | Khoury | |

(Continued)

FOREIGN PATENT DOCUMENTS

JP   3878419 B2   2/2007

*Primary Examiner* — William Hernandez
(74) *Attorney, Agent, or Firm* — Sughrue Mion, PLLC

(57) ABSTRACT

An interface device, including a plurality of interface circuits, wherein each interface circuit of the plurality of interface circuits includes a first switching element connected in series to a second switching element, and a first capacitor and a second capacitor connected to an output terminal to which the first switching element and the second switching element are connected; and a controller configured to determine a plurality of output signals corresponding to the plurality of interface circuits by controlling the first switching element and the second switching element, and configured to adjust a slew rate of the plurality of output signals by charging and discharging the first capacitor and the second capacitor.

20 Claims, 30 Drawing Sheets

(56) References Cited

U.S. PATENT DOCUMENTS

| | | | |
|---|---|---|---|
| 2014/0125414 A1* | 5/2014 | Chen | H03F 3/45224 330/261 |
| 2014/0347111 A1* | 11/2014 | Wong | H03K 19/018507 327/170 |
| 2019/0140627 A1 | 5/2019 | Park | |
| 2020/0412303 A1* | 12/2020 | Astgimath | H03F 3/45094 |

* cited by examiner

INTERFACE CIRCUIT AND INTERFACE DEVICE

CROSS-REFERENCE TO RELATED APPLICATION(S)

This application is based on and claims priority under 35 USC 119(a) to Korean Patent Application No. 10-2020-0000863 filed on Jan. 3, 2020 in the Korean Intellectual Property Office, the disclosure of which is incorporated by reference herein in its entirety.

BACKGROUND

1. Field

The disclosure relates to an interface circuit and an interface device.

2. Description of Related Art

A plurality of integrated circuit chips included in an electronic device may exchange data with each other through an interface circuit. As the capacity of data processed by electronic devices increases, interface circuits capable of providing high-speed data communications between integrated circuit chips have been proposed. In addition, as the number of integrated circuit chips included in electronic devices increases and the types thereof vary, various methods for improving the operation of the interface circuit have been proposed.

SUMMARY

Provided are an interface circuit and an interface device, in which an eye margin of a signal may be improved and data may be transmitted at high speed by adjusting a slew rate of an output signal, and furthermore, electromagnetic interference (EMI) may be significantly reduced.

Additional aspects will be set forth in part in the description which follows and, in part, will be apparent from the description, or may be learned by practice of the presented embodiments.

In accordance with an aspect of the disclosure, an interface circuit includes a first switching element controlled by a first input signal and connected to a first power supply node configured to supply a first power supply voltage and an output node configured to output an output signal; a second switching element controlled by a second input signal different from the first input signal, and connected to the output node and a second power supply node configured to supply a second power supply voltage lower than the first power supply voltage; a first resistor connected between the first power supply node and the first switching element; a second resistor connected between the second power supply node and the second switching element; a first capacitor connected to the output node and controlled by a first control signal; a second capacitor connected to the output node, and controlled by a second control signal different from the first control signal; a third capacitor connected to a node between the first resistor and the first switching element; and a fourth capacitor connected to a node between the second resistor and the second switching element.

In accordance with an aspect of the disclosure, an interface device includes a plurality of interface circuits, wherein each interface circuit of the plurality of interface circuits includes a first switching element connected in series to a second switching element, and a first capacitor and a second capacitor connected to an output terminal to which the first switching element and the second switching element are connected; and a controller configured to determine a plurality of output signals corresponding to the plurality of interface circuits by controlling the first switching element and the second switching element, and configured to adjust a slew rate of the plurality of output signals by charging and discharging the first capacitor and the second capacitor.

In accordance with an aspect of the disclosure, an interface circuit includes a first switching element configured to receive a first power supply voltage and to be turned on and turned off by a first input signal; a second switching element configured to receive a second power supply voltage lower than the first power supply voltage, and to be turned on and turned off by a second input signal different from the first input signal; a first capacitor, wherein a first terminal of the first capacitor is connected to an output node to which the first switching element and the second switching element are connected, and a second terminal of the first capacitor is configured to receive a first control signal; and a second capacitor, wherein a first terminal of the second capacitor is connected to the output node and a second terminal of the second capacitor is configured to receive a second control signal different from the first control signal, wherein based on an output signal output from the output node increasing, at least one of the first control signal and the second control signal increases from a low level to a high level, and wherein based on the output signal decreasing, the at least one of the first control signal and the second control signal decreases from the high level to the low level.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION

Hereinafter, example embodiments will be described with reference to the accompanying drawings. The embodiments described herebelow are all exemplary, and thus, the inventive concept is not limited to these embodiments disclosed below and may be realized in various other forms.

Figure 1:
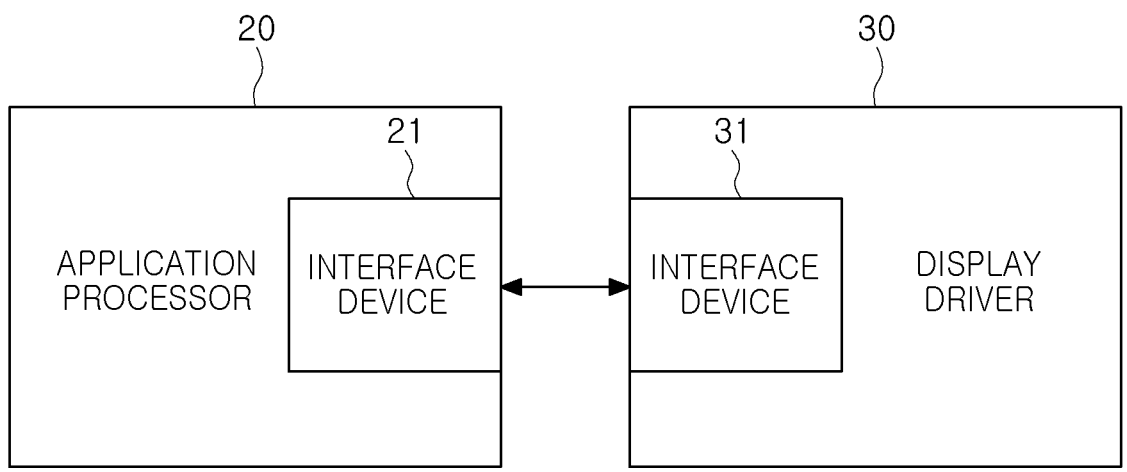
FIGS. 1 and 2 are diagrams schematically illustrating an electronic device including an interface circuit according to an example embodiment.

FIG. 1 is a simplified block diagram of an electronic device including an interface circuit according to an example embodiment.

Referring to FIG. 1, an electronic device 10 may include an application processor 20 and a display driver 30. The interface device 21 of an application processor 20 may exchange data with an interface device 31 of the display driver 30. Each of the interface devices 21 and 31 may include a plurality of interface circuits.

The interface devices 21 and 31 may exchange data with each other according to a predetermined protocol. For example, the interface device 21 of the application processor 20 and the interface device 31 of the display driver 30 may exchange data according to a protocol defined in the Mobile Industry Processor Interface (MIPI) standard. Each of the interface devices 21 and 31 may include a transmitting circuit and a receiving circuit.

Figure 2:
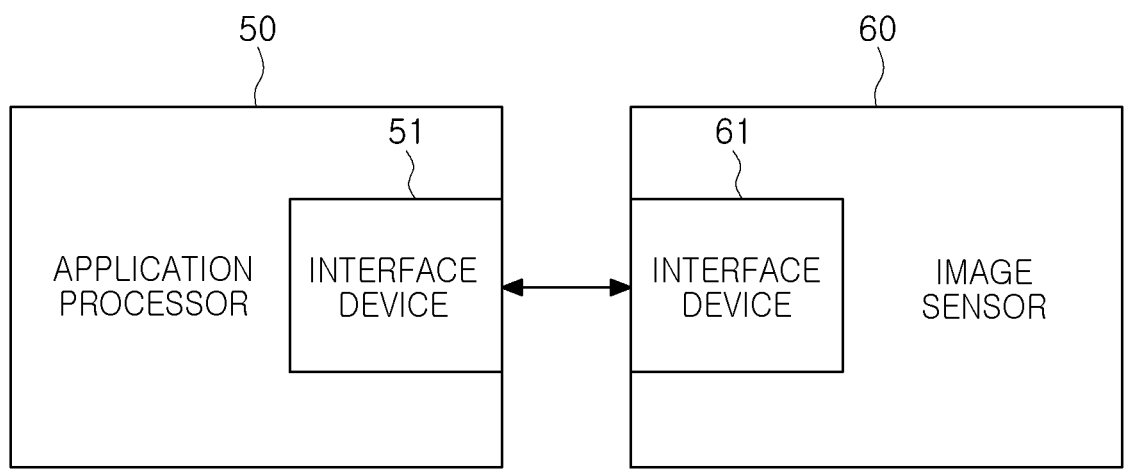

Next, referring to FIG. 2, in an electronic device 40, an application processor 50 may exchange data with an image sensor 60. An interface device 51 of the application processor 50 and an interface device 61 of the image sensor 60 may exchange data with each other. Similar to the embodiment described with reference to FIG. 1, the interface devices 51 and 61 may include a plurality of interface circuits for exchanging data.

The interface circuit included in at least one of the interface devices 21, 31, 51 and 61 according to an example embodiment may have a function of adjusting a slew rate of an output signal. The slew rate of the output signal may be determined by a control signal input to the interface devices 21, 31, 51 and 61 by controllers included in the application processors 20 and 50, the display driver 30 and the image sensor 60. In an example embodiment, the controllers may increase the slew rate of the output signal when it is determined that high-speed data transmission is necessary. In addition, the controllers may reduce the slew rate of the output signal when high-speed data transmission is not required and EMI characteristics need to be improved.

Figure 3:
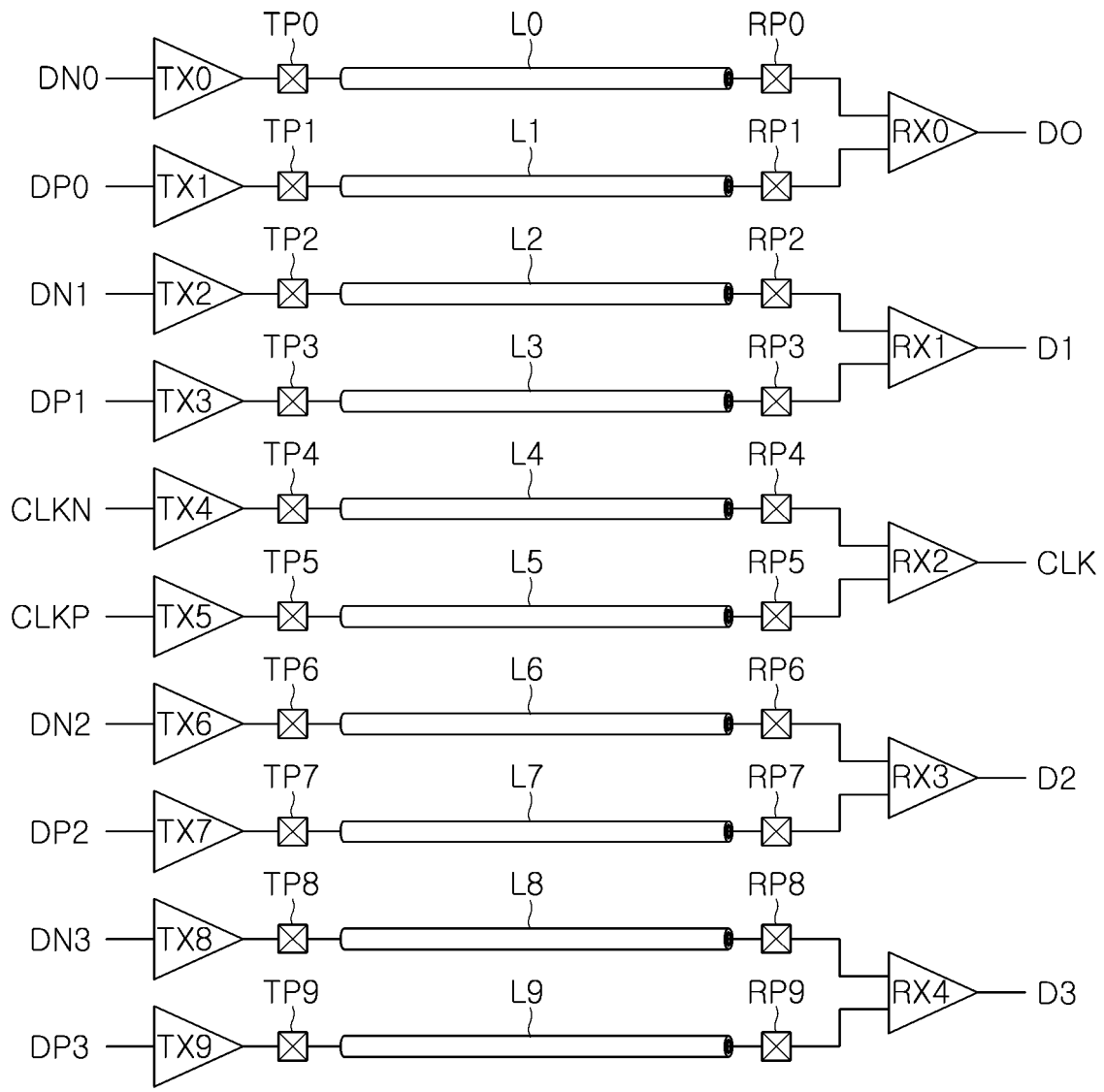
FIGS. 3 and 4 are diagrams illustrating operations of an interface device according to an example embodiment.
Figure 4:
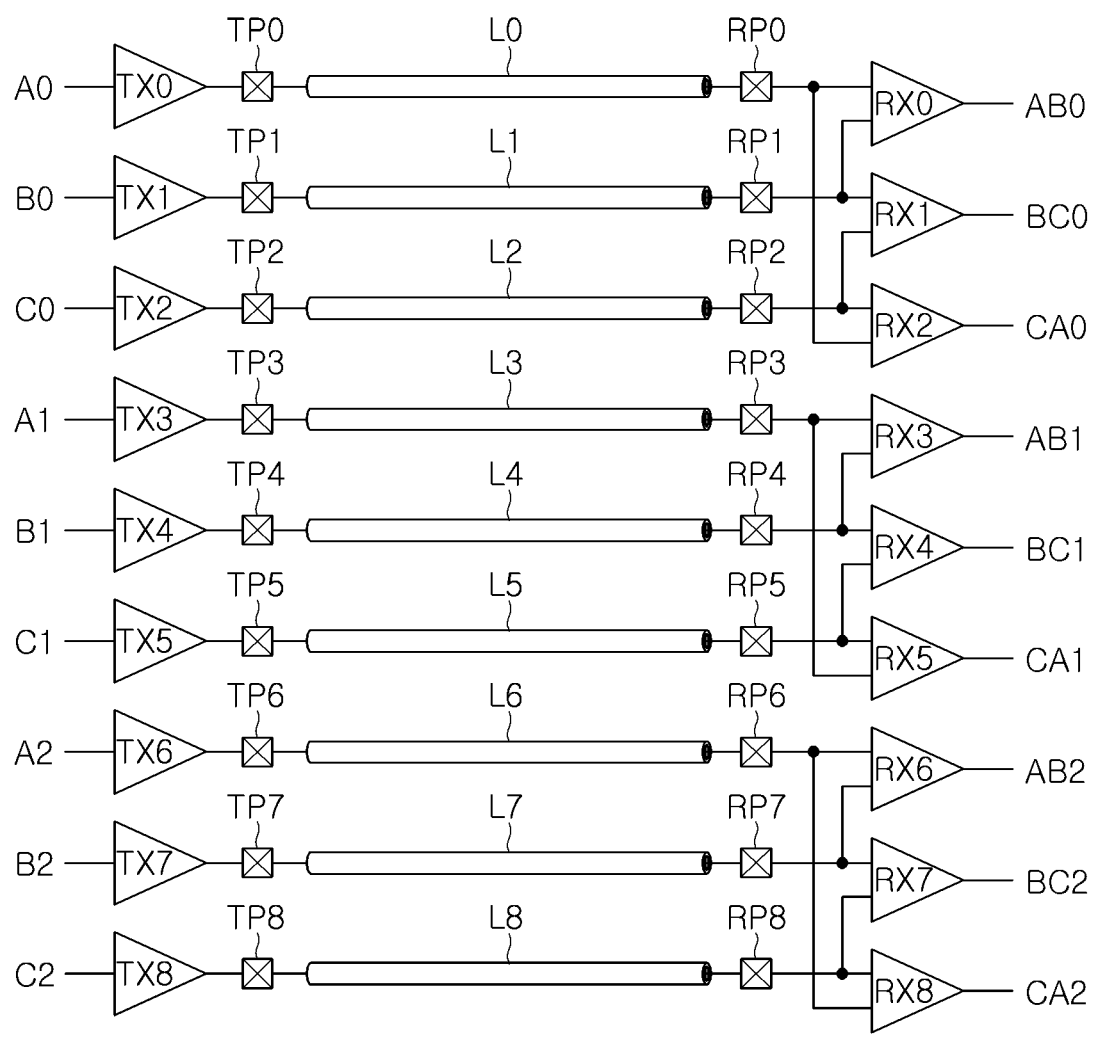

FIGS. 3 and 4 are diagrams provided to illustrate the operation of an interface device according to an example embodiment.

FIG. 3 is a diagram illustrating the operation of an interface device 70 that transmits data and a clock signal using a differential signal method. For example, the example embodiment described with reference to FIG. 3 may be applied to a D-phy interface according to the MIPI standard. Referring to FIG. 3, a plurality of transmitters TX0-TX9 may output data DN0-DN3 and DP0-DP3 and clock signals CLKN and CLKP through a plurality of transmission pads TP0-TP9.

The transmission pads TP0-TP9 may be connected to a plurality of receiving pads RP0-RP9 through a plurality of data lanes L0-L9, and the receiving pads RP0-RP9 may be connected to a plurality of receivers RX0-RX4. For example, each of the receivers RX0-RX4 may be connected to a pair of receiving pads RP0-RP9, and the receivers RX0-RX4 may generate data D0-D3 and a clock signal CLK using a differential signal method. Accordingly, in the example embodiment illustrated in FIG. 3, to transmit data using a differential signaling method, 10 transmission pads TP0-TP9 and 10 data lanes L0-L9 and 10 receiving pads RP0-RP9 may be used. According to example embodiments, dummy pads to obtain an electrical shielding effect may be added to the transmitting pads TP0-TP9 and the receiving pads RP0-RP9. For example, the interface device 70 illustrated in FIG. 3 may be applied to an application processor, a display driver, an image sensor, and the like.

FIG. 4 is a diagram provided to describe the operation of an interface device 80 that transmits data using a single-ended signal method. For example, the example embodiment described with reference to FIG. 4 may be applied to a C-phy interface according to the MIPI standard. Referring to FIG. 4, the plurality of transmitters TX0-TX8 may output data A0-C0, A1-C1 and A2-C2 through the plurality of transmission pads TP0-TP8. Since image data may be output by a single-ended signal method, a data lane for outputting a clock signal may not be present separately in the interface according to the example embodiment illustrated in FIG. 4.

The transmission pads TP0-TP8 may be connected to the plurality of receiving pads RP0-RP8 through the plurality of data lanes L0-L8, and the receiving pads RP0-RP8 may be connected to the plurality of receivers RX0-RX8. The transmission pads TP0-TP8 may be divided into a plurality of groups TP0-TP2, TP3-TP5, and TP6-TP8 depending on data A0-C0, A1-C1 and A2-C2, and the receiving pads RP0-RP8 may also be divided into a plurality of groups RP0-RP2, RP3-RP5 and RP6-RP8. Each of the receivers RX0-RX8 may receive a pair of receiving pads RP0-RP8 included in each of the groups RP0-RP2, RP3-RP5, and RP6-RP8. For example, first receiver RX0 may output a difference between a signal A0 and a signal B0, and second receiver RX1 may output a difference between the signal B0 and a signal C0. Also, third receiver RX2 may output a difference between the signal C0 and the signal A0.

In the example embodiment illustrated in FIG. 4, to transmit data using a single-ended signal method, 9 transmission pads TP0-TP8, 9 data lanes L0-L8, and 9 receiving pads RP0-RP8 may be required. However, even using a single-ended signal method, according to example embodiments, dummy pads to obtain an electrical shielding effect may be added. The interface device 80 illustrated in FIG. 4 may also be applied to an application processor, a display driver, and an image sensor.

As the capacity of data transmitted by the interface devices 70 and 80 gradually increases and the data transmission speed required by the system increases, noise characteristics of a signal output by the interface devices 70 and 80 may deteriorate. In example embodiments, the noise characteristics of the interface devices 70 and 80 may be improved by connecting a capacitor to the output terminals of the interface devices 70 and 80 and controlling charging and discharging of the capacitor. In addition, by controlling the charging and discharging of the capacitor depending on the operation of the interface devices 70 and 80, the slew rates of the interface devices 70 and 80 may be adjusted to operate the interface devices 70 and 80 with optimal characteristics.

Figure 5:
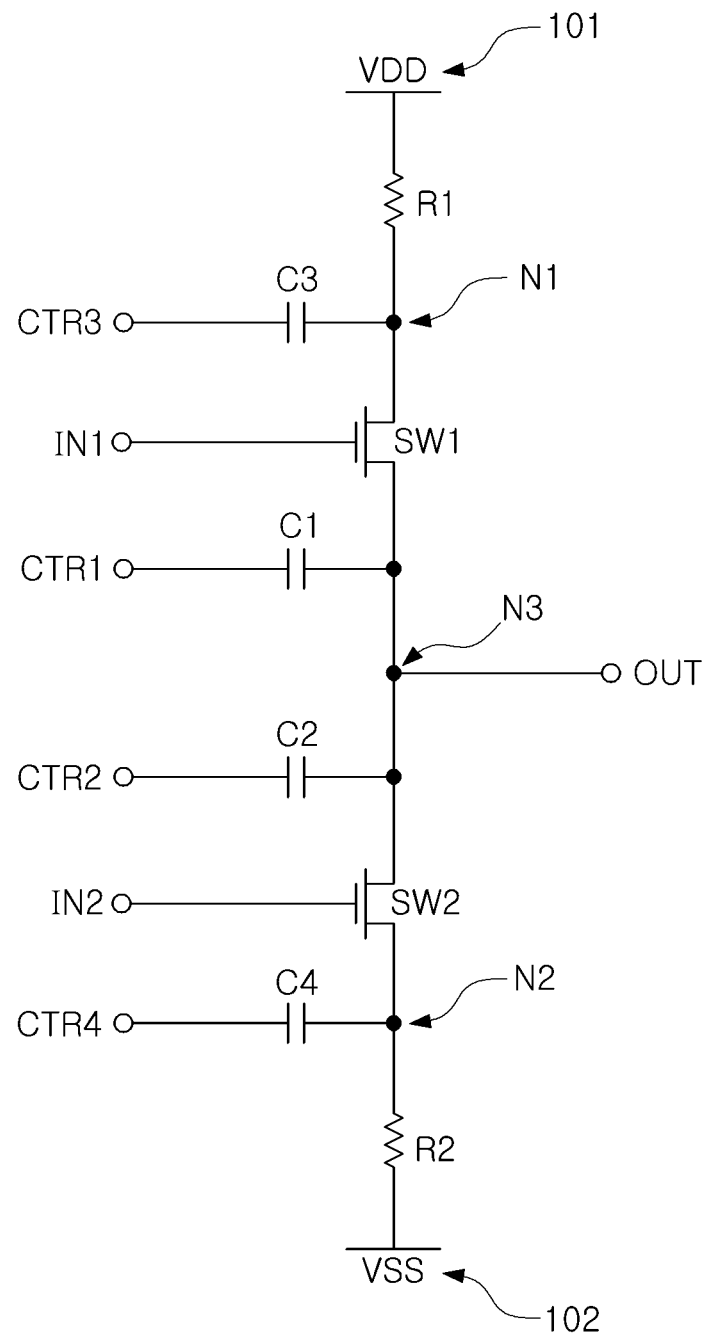
FIG. 5 is a circuit diagram of an interface circuit according to an example embodiment.

FIG. 5 is a circuit diagram of an interface circuit according to an example embodiment.

Referring to FIG. 5, an interface circuit 100 according to an example embodiment may include a first switching element SW1, a second switching element SW2, a first capacitor C1, a second capacitor C2, a third capacitor C3, a fourth capacitor C4, a first resistor R1, and a second resistor R2. The first switching element SW1 and the second switching element SW2 may be connected to each other in series, between a first power supply node 101 and a second power supply node 102.

The first switching element SW1 may be connected to the first power supply node 101 through the first resistor R1, and the second switching element SW2 may be connected to the second power supply node 102 through the second resistor R2. A first power supply voltage VDD may be supplied through the first power supply node 101, and a second power supply voltage VSS may be supplied through the second power supply node 102. In an example embodiment, the first power supply voltage VDD may be greater than the second power supply voltage VSS.

In the example embodiment illustrated in FIG. 5, a node between the first resistor R1 and the first switching element SW1 may be defined as a first node N1, and a node between the second resistor R2 and the second switching element SW2 may be defined as a second node N2. An output node N3 may be defined between the first switching element SW1 and the second switching element SW2. An output signal OUT output to the output node N3 may be determined by a first input signal IN1 that controls the first switching element SW1 and a second input signal IN2 that controls the second switching element SW2.

The first capacitor C1 and the second capacitor C2 may be connected to the output node N3. The first capacitor C1 may be charged and discharged by a first control signal CTR1, and the second capacitor C2 may be charged and discharged by a second control signal CTR2. The third capacitor C3 may be connected to the first node N1, and the fourth capacitor C4 may be connected to the second node N2. The third capacitor C3 may be charged and discharged by a third control signal CTR3, and the fourth capacitor C4 may be charged and discharged by a fourth control signal CTR4.

In an example embodiment, the first to fourth capacitors C1-C4 may be implemented as a metal-oxide-semiconductor (MOS) capacitor or the like. When the first to fourth capacitors C1-C4 are MOS capacitors, the first to fourth control signals CTR1-CTR4 may input to the gate terminals of the first to fourth capacitors C1-C4, respectively.

The capacitance values of the first to fourth capacitors C1-C4 may be variously selected. For example, the capacitance values of the first and second capacitors C1 and C2 may be greater than the capacitance values of the third and fourth capacitors C3 and C4. For example, the capacitance values of the first and second capacitors C1 and C2 may be 2 times or more and 10 times or less of the capacitance values of the third and fourth capacitors C3 and C4. In an example embodiment, the capacitance values of the first and second capacitors C1 and C2 may be about 5 times the capacitance values of the third and fourth capacitors C3 and C4. In addition, in an example embodiment, the first capacitor C1 and the second capacitor C2 may have the same capacitance value, and the third capacitor C3 and the fourth capacitor C4 may have the same capacitance value.

When an interface circuit 100 transmits data using a differential signal method, the first input signal IN1 and the second input signal IN2 may have opposite phases. For example, the first input signal IN1 may be a complementary signal of the second input signal IN2. When the first switching element SW1 is turned on by the first input signal IN1 and the second switching element SW2 is turned off by the second input signal IN2, the output signal OUT may have a high level. In addition, when the first switching element SW1 is turned off by the first input signal IN1 and the second switching element SW2 is turned on by the second input signal IN2, the output signal OUT may have a low level.

When the output signal OUT decreases from a high level to a low level, or increases from a low level to a high level, the slew rate of the output signal OUT may be affected by the magnitude of the first input signal IN1 and the second input signal IN2, and by parasitic components or the like present in respective elements and nodes 101, 102 and N1-N3. In an example embodiment, the slew rate of the output signal OUT may be increased or decreased by controlling charging and discharging of the first to fourth capacitors C1-C4.

When the interface circuit 100 transmits data using a single-ended signal method, the first input signal IN1 and the second input signal IN2 may not have entirely opposite phases. For at least some amount of time, the first input signal IN1 and the second input signal IN2 may have the same value, and the output signal OUT may have one of a high level, a low level, and a middle level between the high level and the low level.

Even when the interface circuit 100 transmits data using a single-ended signal method, the slew rate of the output signal OUT may be increased or decreased by controlling charging and discharging of the first to fourth capacitors C1-C4. In an example embodiment, at least one of the first to fourth capacitors C1-C4 may be controlled using different methods when the interface circuit 100 operates in a differential signal method and in a single-ended signal method. For example, when the interface circuit 100 operates in a differential signal method, the second capacitor C2 may receive the first input signal IN1 as the second control signal CTR2, and when the interface circuit 100 operates in a single-ended signal method, the second capacitor C2 may receive a signal different from the first input signal IN1 as the second control signal CTR2.

The interface circuit 100 according to the example embodiment illustrated in FIG. 5 may be defined as a unit circuit, and a plurality of unit circuits may be connected to one output pad that outputs the output signal OUT, in an example embodiment of an interface device. For example, one or more first unit circuits and one or more second unit circuits may be connected to one output pad. For example, the values of the resistors R1 and R2 and the capacitors C1-C4 included in the first unit circuit may be the same as, or different from, the values of the resistors R1 and R2 and the capacitors C1-C4 included in the second unit circuit.

In an example embodiment, five first unit circuits and two second unit circuits may be connected to one output pad. For example, the sum of turn-on resistance of the first resistor R1 and the first switching element SW1 included in each of the first unit circuits may be half of the sum of turn-on resistance of the first resistor R1 and the first switching element SW1 included in each of the second unit circuits. Similarly, the sum of turn-on resistance of the second resistor R2 and the second switching element SW2 included in each of the first unit circuits may be half of the sum of turn-on resistance of the second resistor R2 and the second switching element SW2 included in each of the second unit circuits. In an example embodiment of an interface device, a required resistance value may be set by appropriately controlling the first switching element SW1 and the second switching element SW2 respectively included in the first unit circuits and the second unit circuits.

In an example embodiment, the size of each of the first switching element SW1 and the second switching element SW2 may be determined based on the resistance conditions as described above. For example, assuming that the gate lengths of the first switching elements and the second switching elements included in each of the first unit circuits and the second unit circuits are the same, a gate width of the first switching element included in the first unit circuits may be twice a gate width of the first switching element included in the second unit circuits. In the above example, the gate width may be defined in a direction intersecting the gate length. Similarly, a gate width of the second switching element included in the first unit circuits may be twice a gate width of the second switching element included in the second unit circuits.

In an embodiment including the number of the first unit circuits and the second unit circuits as described above, the first capacitor C1 included in the first unit circuit may have the capacity of about twice the capacity of the first capacitor C1 included in the second unit circuit. In addition, the second capacitor C2 included in the first unit circuit may have the capacity of about twice the capacity of the second capacitor C2 included in the second unit circuit.

In the case of a C-Phy interface operating using a single-ended signal method, as described above with reference to FIG. 4, at least three output pads may be required to transmit data. The output signals output from the three output pads may not have the same value, and as described above, may have one of a high level, a low level, and a middle level. For example, the number of unit circuits operating among the plurality of unit circuits connected to the output pad may be changed depending on the output signal OUT output through the output pad.

Figure 6:
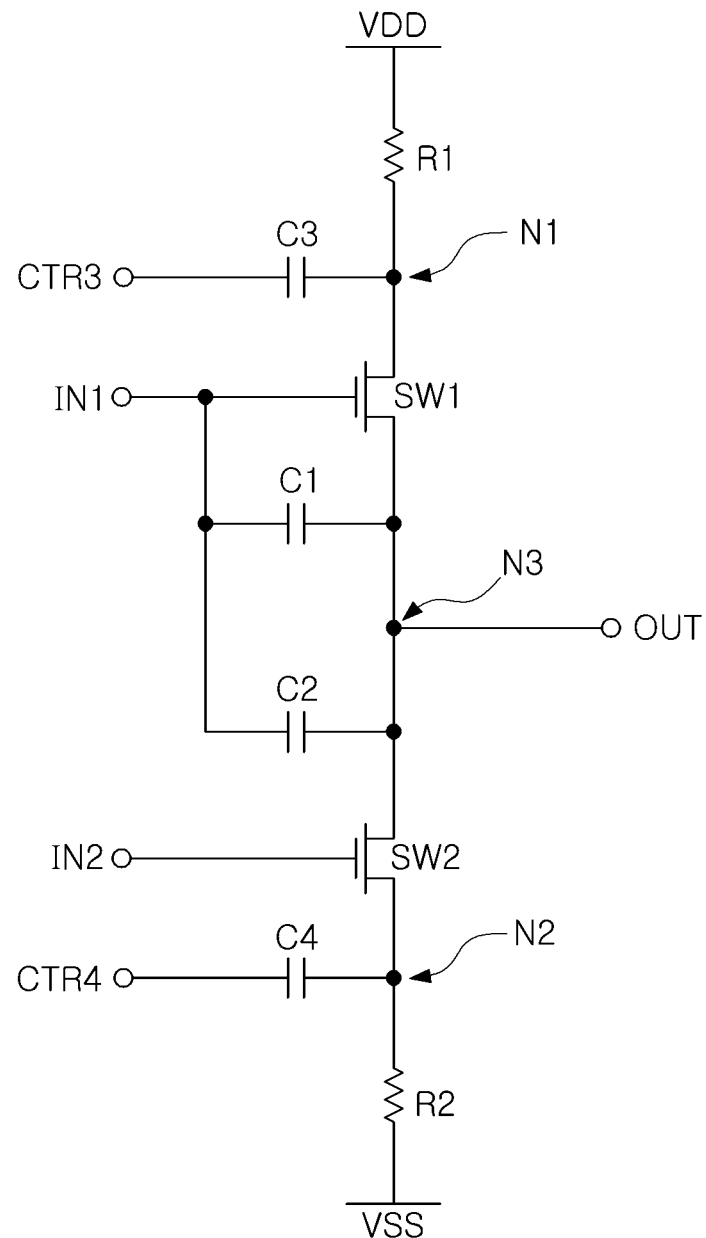
FIGS. 6 and 7 are diagrams illustrating the operation of an interface circuit according to an example embodiment.
Figure 7:
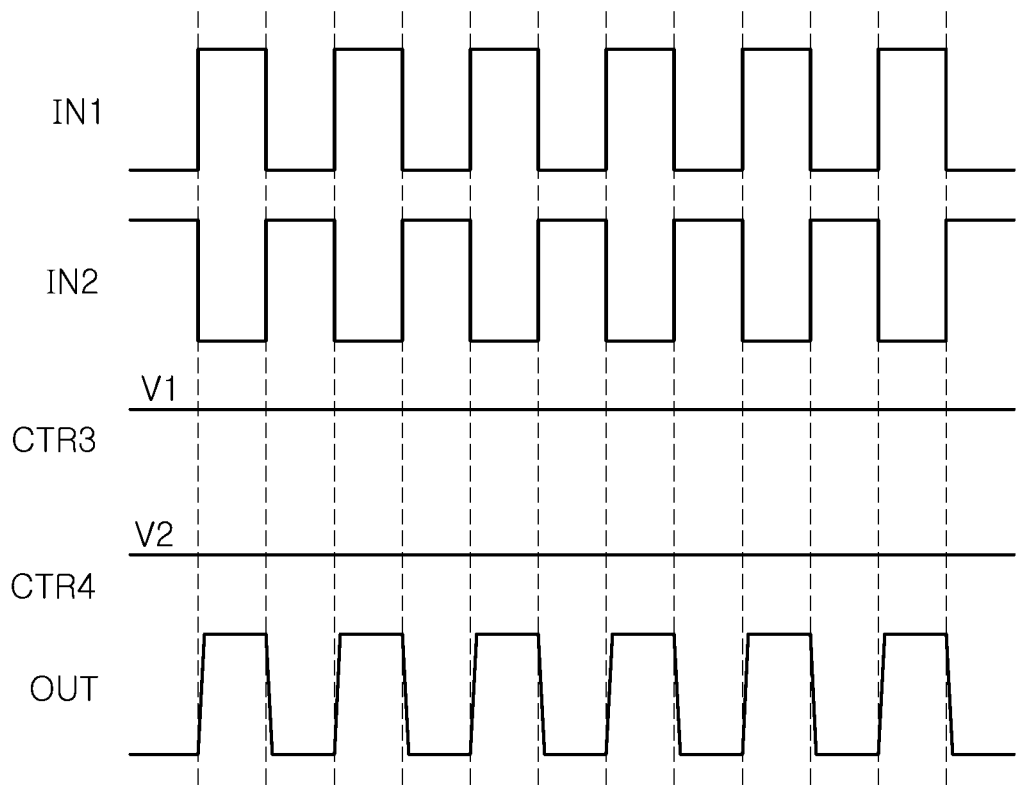

FIGS. 6 and 7 are diagrams provided to illustrate the operation of an interface circuit according to an example embodiment.

In an example embodiment described with reference to FIGS. 6 and 7, an interface circuit 110 may operate using a differential signal method. As illustrated in FIG. 7, when the first switching element SW1 is turned on and the second switching element SW2 is turned off, the output signal OUT has a high level, and when the first switching element SW1 is turned off and the second switching element SW2 is turned on, the output signal OUT may have a low level.

In an example embodiment illustrated in FIG. 6, the first capacitor C1 and the second capacitor C2 may be charged and discharged by the first input signal IN1. In detail, the first control signal input to the first capacitor C1 and the second control signal input to the second capacitor C2 may be the same as the first input signal IN1. Accordingly, an equivalent circuit may be defined as illustrated in FIG. 6.

In an example embodiment, the third control signal CTR3 input to the third capacitor C3 and the fourth control signal CTR4 input to the fourth capacitor C4 may each be a predetermined constant voltage signal. Referring to FIG. 7, the magnitude of the third control signal CTR3 may have a first constant voltage V1, and the magnitude of the fourth control signal CTR4 may have a second constant voltage V2. The magnitudes of the first constant voltage V1 and the second constant voltage V2 may be variously determined. For example, the magnitudes of the first constant voltage V1 and the second constant voltage V2 may be the same. The first constant voltage V1 and the second constant voltage V2 may have different magnitudes, and the first constant voltage V1 may be greater than the second constant voltage V2, or the first constant voltage V1 may be less than the second constant voltage V2.

Referring to FIGS. 6 and 7 together, when the first switching element SW1 is turned on by the first input signal IN1, the second switching element SW2 may be turned off by the second input signal IN2. Also, when the first switching element SW1 is turned on, the first capacitor C1 and the second capacitor C2 may be charged. As the first capacitor C1 and the second capacitor C2 are charged, the output signal OUT may rapidly increase from a low level to a high level.

When the first switching element SW1 is turned off by the first input signal IN1 and the second switching element SW2 is turned on by the second input signal IN2, the output signal OUT may decrease from high level to low level. The first capacitor C1 and the second capacitor C2 may be discharged by the first input signal IN1, and the output signal OUT may rapidly decrease from a high level to a low level. Therefore, in the example embodiment described with reference to FIGS. 6 and 7, the slew rate of the output signal OUT may be increased.

Figure 8:
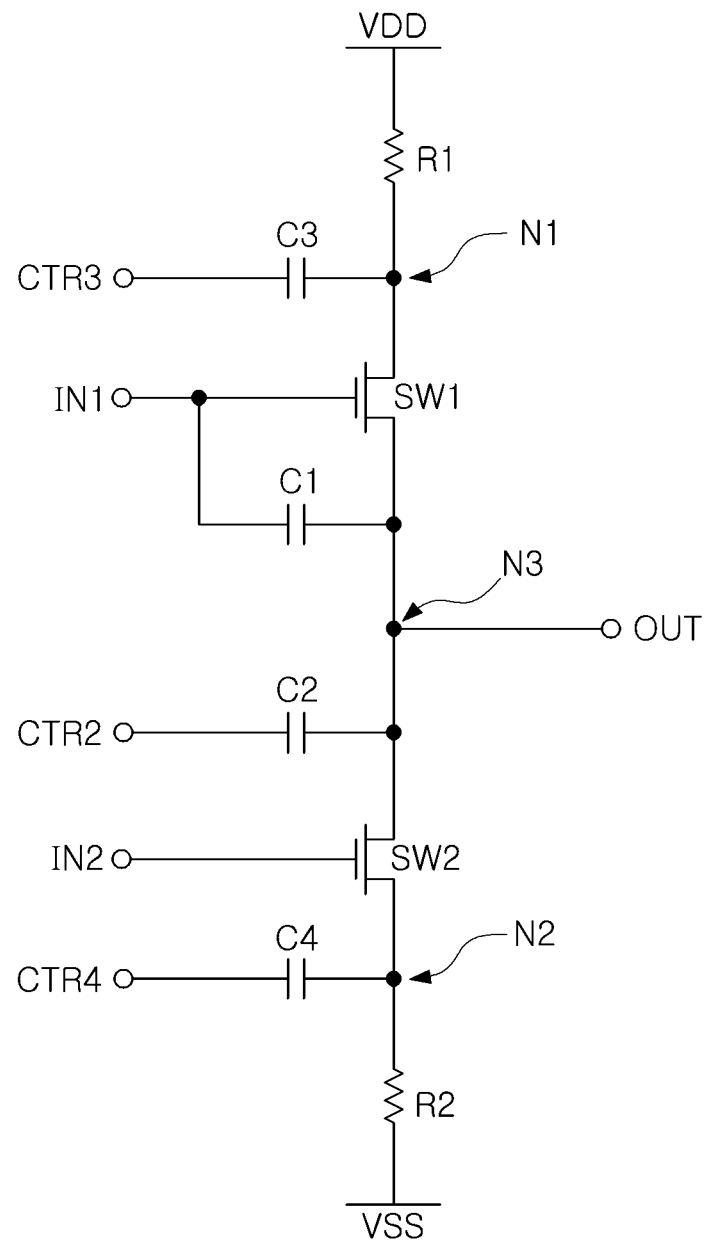
FIGS. 8 and 9 are diagrams illustrating the operation of an interface circuit according to an example embodiment.
Figure 9:
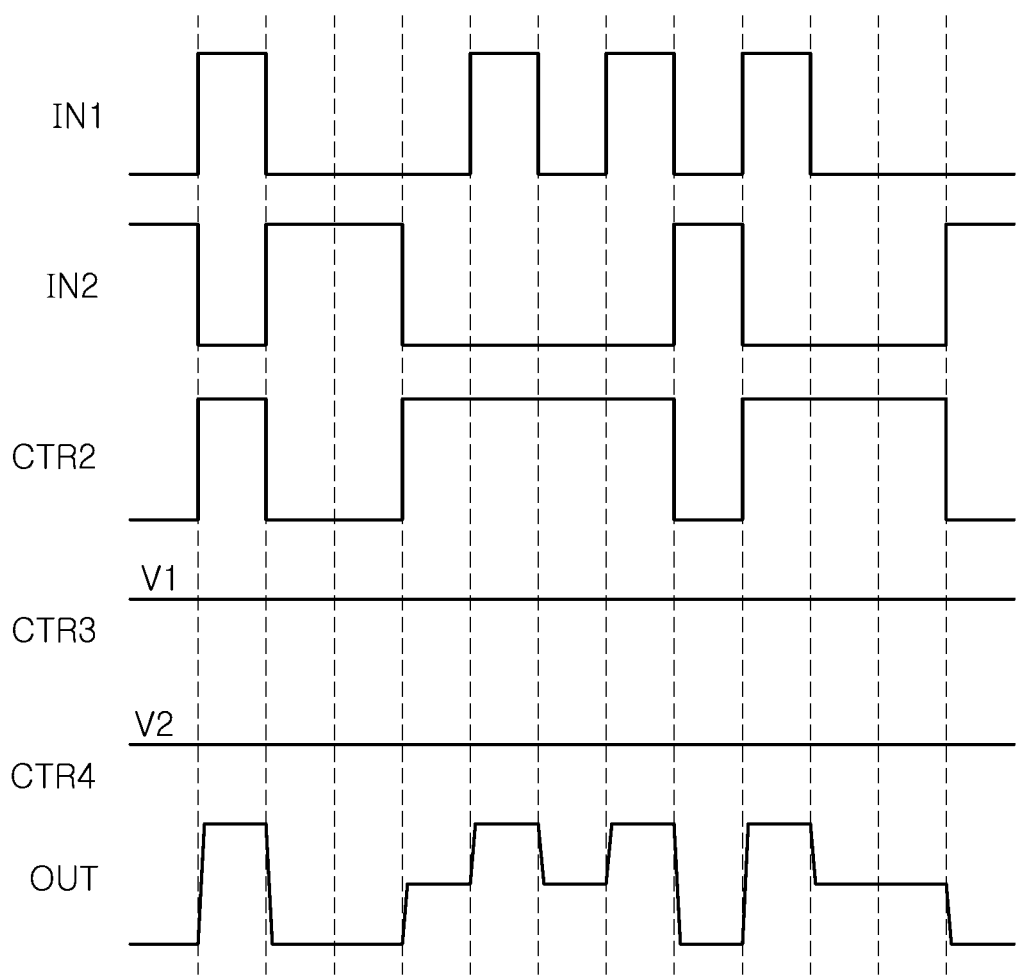

FIGS. 8 and 9 are diagrams provided to illustrate the operation of an interface circuit according to an example embodiment.

In an example embodiment described with reference to FIGS. 8 and 9, an interface circuit 120 may operate using a single-ended signal method. Referring to FIG. 9, when a first switching element SW1 is turned on and a second switching element SW2 is turned off, an output signal OUT increases from a low level to a high level, when the first switching element SW1 is turned off and the second switching element SW2 is turned on, the output signal OUT may decrease from a high level to a low level. In addition, as one of the first switching element SW1 and the second switching element SW2 is turned on or off, the output signal OUT may have a middle level between a high level and a low level. As an example, the output signal OUT may be determined as illustrated in Table 1 below.

TABLE 1

| First Input Signal (IN1) | Second Input Signal (IN2) | Output Signal (OUT) |
| --- | --- | --- |
| Low → High | High → Low | Low → High |
| High → Low | Low → High | High → Low |
| Low | High → Low | Low → Mid |
| Low | Low → High | Middle → Low |
| Low → High | Low | Middle → High |
| High → Low | Low | High → Mid |

A first capacitor C1 in the interface circuit 120 may be charged and discharged by a first input signal IN1. In detail, a first control signal input to the first capacitor C1 may be the same as the first input signal IN1. Accordingly, an equivalent circuit of an interface circuit 110 may be represented as illustrated in FIG. 8.

Referring to FIG. 9, a second control signal CTR2 input to a second capacitor C2 may have a complementary relationship with a second input signal IN2. The first input signal IN1 input to the first capacitor C1 may be input as a first control signal, and a signal having a complementary relationship with the second input signal IN2 is input to the second capacitor C2 as a second control signal CTR2, thereby increasing the slew rate of the output signal OUT.

Referring to FIG. 9, when the amount of change of the output signal OUT is a first value, only one of the first control signal CTR1 and the second control signal CTR2 may be increased or decreased, and when the amount of change of the output signal OUT is the second value, the first control signal CTR1 and the second control signal CTR2 may increase or decrease simultaneously. The first value may be a difference between a high level and a middle level, and a difference between a middle level and a low level, and the second value may be a difference between a high level and a low level.

For example, when the output signal OUT increases from a low level to a middle level, only the second control signal CTR2 may increase, and when the output signal OUT increases from a middle level to a high level, only the first control signal CTR1 may increase. When the output signal OUT decreases from a high level to a middle level, only the first control signal CTR1 may be reduced. When the output signal OUT decreases from a middle level to a low level, only the second control signal CTR2 may be decreased. When the output signal OUT increases from a low level to a high level, the first control signal CTR1 and the second control signal CTR2 may increase at the same time, and when the output signal OUT decreases from the high level to the low level, the first control signal CTR1 and the second control signal CTR2 may be simultaneously reduced.

Each of a third control signal CTR3 input to a third capacitor C3 and a fourth control signal CTR4 input to a fourth capacitor C4 may be a predetermined constant voltage signal. Referring to FIG. 9, the magnitude of the third control signal CTR3 may have a first constant voltage V1, and the magnitude of the fourth control signal CTR4 may have a second constant voltage V2. As described above with reference to FIGS. 6 and 7, the magnitudes of the first constant voltage V1 and the second constant voltage V2 may be variously determined.

Referring to FIGS. 8 and 9 together, when the first switching element SW1 is turned on by the first input signal IN1, the first capacitor C1 is charged to rapidly increase the output signal OUT. In addition, when the second switching element SW2 is turned on by the second input signal IN2, the second capacitor C2 is discharged to rapidly decrease the output signal OUT. Therefore, the slew rate of the output signal OUT may be increased.

Figure 10:
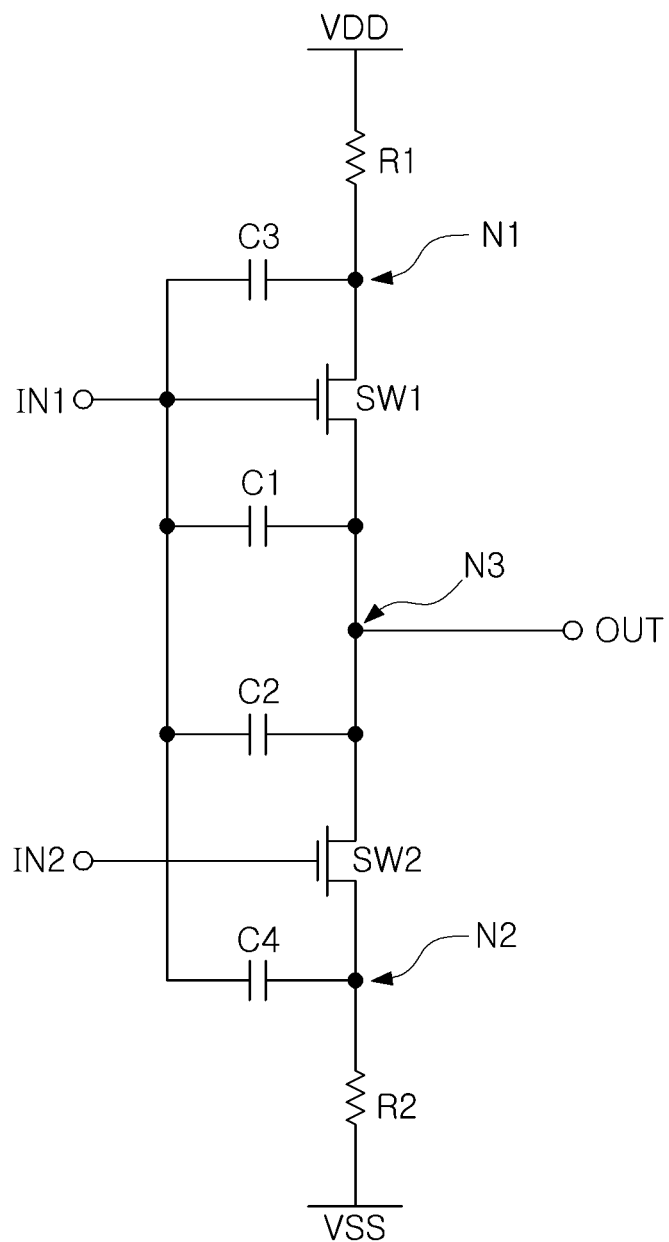
FIGS. 10 and 11 are diagrams illustrating the operation of an interface circuit according to an example embodiment.
Figure 11:
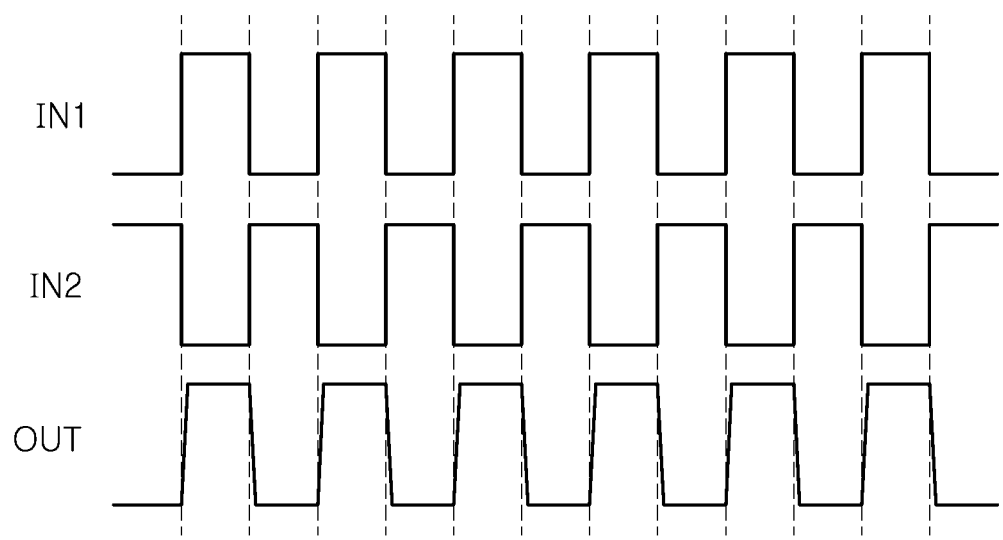

FIGS. 10 and 11 are views provided to illustrate the operation of an interface circuit according to an example embodiment.

In example embodiment described with reference to FIGS. 10 and 11, an interface circuit 130 may operate using a differential signal method. The first to fourth capacitors C1 to C4 in the interface circuit 130 may be charged and discharged by the first input signal IN1. In detail, the first to fourth control signals input to the first to fourth capacitors C1-C4 may be the same as the first input signal IN1. Accordingly, an equivalent circuit of the interface circuit 130 may be represented as illustrated in FIG. 10.

When the first switching element SW1 is turned on by the first input signal IN1, the second switching element SW2 may be turned off by the second input signal IN2. Also, the first to fourth capacitors C1 to C4 may be charged when the first switching element SW1 is turned on. Since the first to fourth capacitors C1-C4 are charged, the output signal OUT may rapidly increase from a low level to a high level.

When the first switching element SW1 is turned off by the first input signal IN1 and the second switching element SW2 is turned on by the second input signal IN2, the output signal OUT may decrease from high level to low level. The first to fourth capacitors C1-C4 may be discharged by the first input signal IN1, and the output signal OUT may rapidly decrease from a high level to a low level. Therefore, in the example embodiment described with reference to FIGS. 10 and 11, the slew rate of the output signal OUT may be increased.

Figure 12:
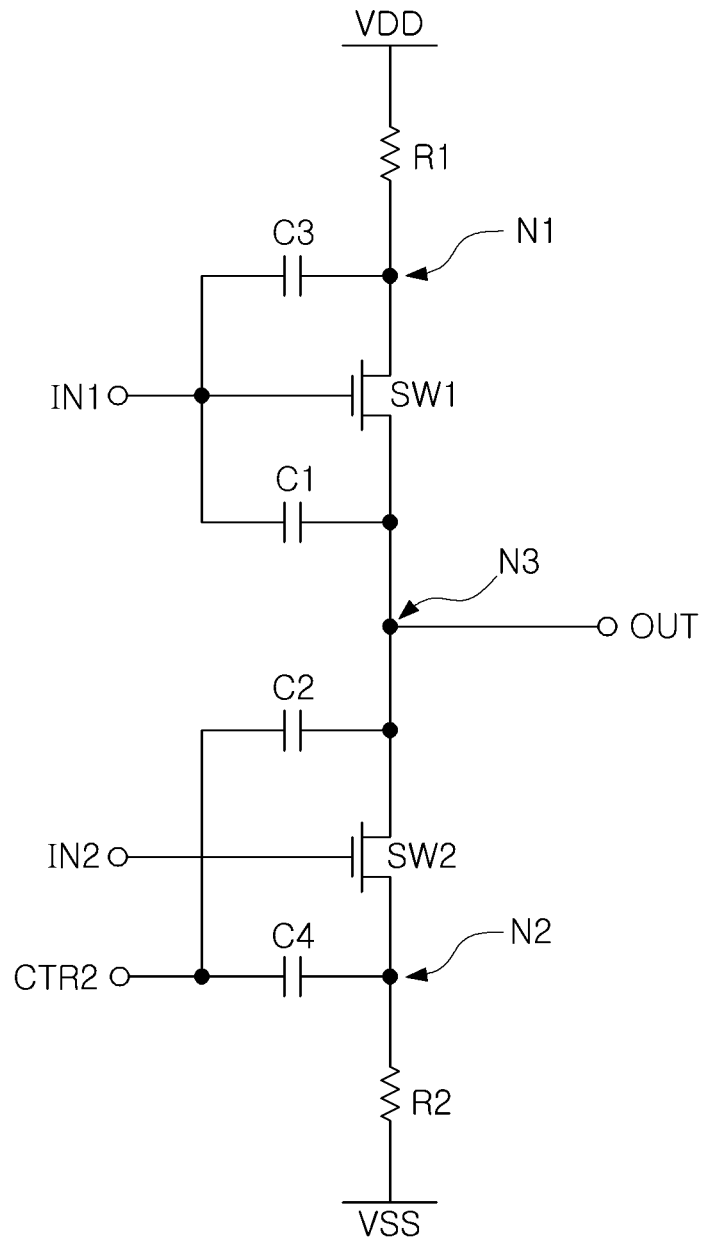
FIGS. 12 and 13 are diagrams illustrating the operation of an interface circuit according to an example embodiment.
Figure 13:
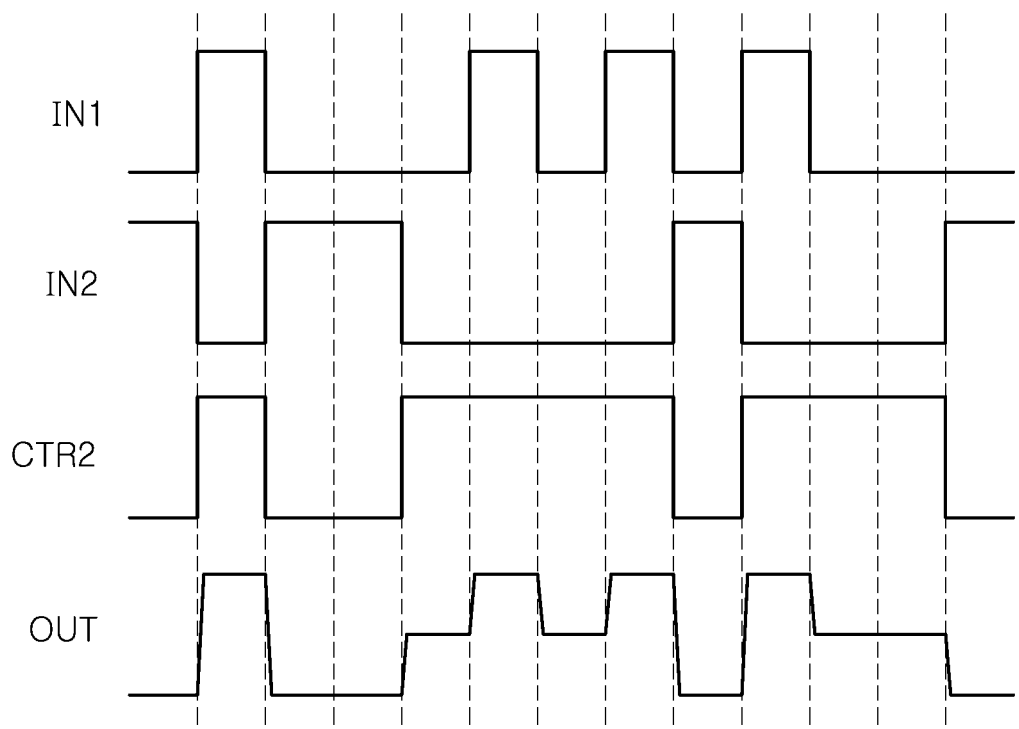

FIGS. 12 and 13 are views provided to illustrate the operation of the interface circuit according to an example embodiment.

In an example embodiment described with reference to FIGS. 12 and 13, an interface circuit 140 may operate using a single-ended signal method. The output signal OUT may be determined by the first input signal IN1 and the second input signal IN2 as illustrated in Table 1 described above.

Referring to FIG. 12, the first capacitor C1 and the third capacitor C3 in the interface circuit 140 may be charged and discharged by the first input signal IN1. In addition, the second capacitor C2 and the fourth capacitor C4 may be simultaneously charged or discharged by receiving the second control signal CTR2 in common. Accordingly, the equivalent circuit of the interface circuit 140 may be represented as illustrated in FIG. 12. Referring to FIG. 13, the second control signal CTR2 may have a complementary relationship with the second input signal IN2.

When the first switching element SW1 is turned on by the first input signal IN1, the first capacitor C1 and the third capacitor C3 are charged to rapidly increase the output signal OUT. In addition, when the second switching element SW2 is turned on by the second input signal IN2, the second capacitor C2 and the fourth capacitor C4 are discharged so that the output signal OUT may rapidly decrease. Therefore, the slew rate of the output signal OUT may be increased.

Figure 14:
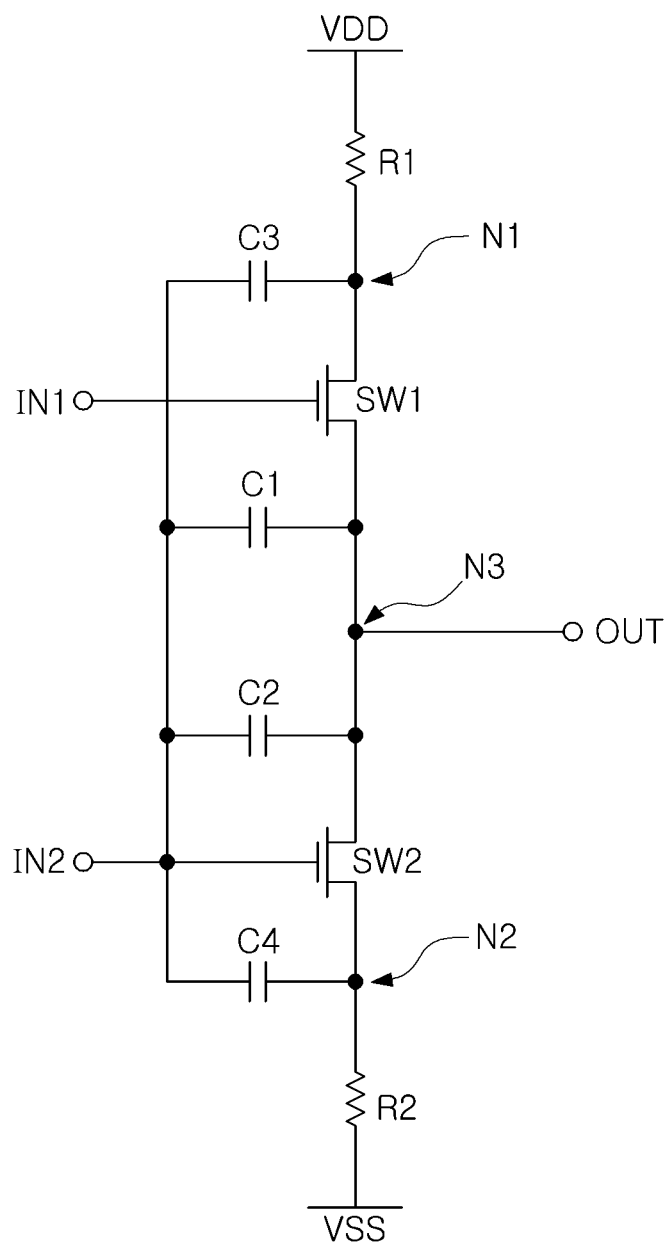
FIGS. 14 and 15 are diagrams illustrating the operation of an interface circuit according to an example embodiment.
Figure 15:
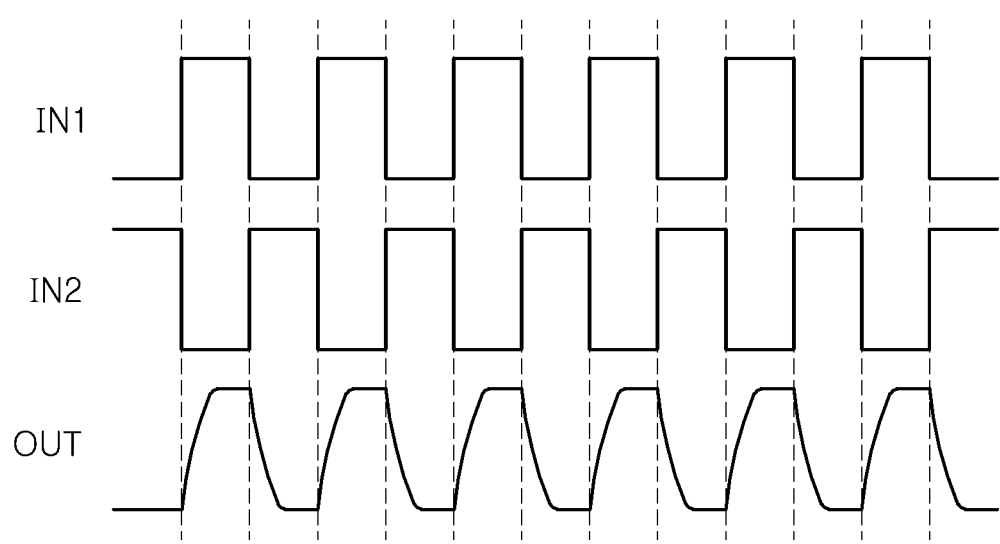

FIGS. 14 and 15 are views provided to illustrate the operation of an interface circuit according to an example embodiment.

In an example embodiment described with reference to FIGS. 14 and 15, the output signal OUT may be a differential signal, and the first to fourth capacitors C1-C4 may be charged and discharged by the second input signal IN2. In detail, the first to fourth control signals input to the first to fourth capacitors C1-C4 may be the same as the second input signal IN2. Accordingly, an equivalent circuit of an interface circuit 150 may be represented as illustrated in FIG. 14.

When the first switching element SW1 is turned on by the first input signal IN1, the second switching element SW2 may be turned off by the second input signal IN2. Also, the first to fourth capacitors C1 to C4 may be discharged when the second switching element SW2 is turned off. Because the first to fourth capacitors C1 to C4 are discharged, the speed at which the output signal OUT increases from a low level to a high level may decrease.

When the first switching element SW1 is turned off by the first input signal IN1 and the second switching element SW2 is turned on by the second input signal IN2, the output signal OUT may decrease from high level to low level. At this time, the first to fourth capacitors C1-C4 may be charged by the second input signal IN2, and the output signal OUT may slowly decrease from a high level to a low level. Therefore, in the example embodiment described with reference to FIGS. 14 and 15, the slew rate of the output signal OUT may be reduced. As the slew rate of the output signal OUT decreases, a noise component generated in the interface circuit 150, for example, electromagnetic interference (EMI) or the like, may be reduced.

Figure 16:
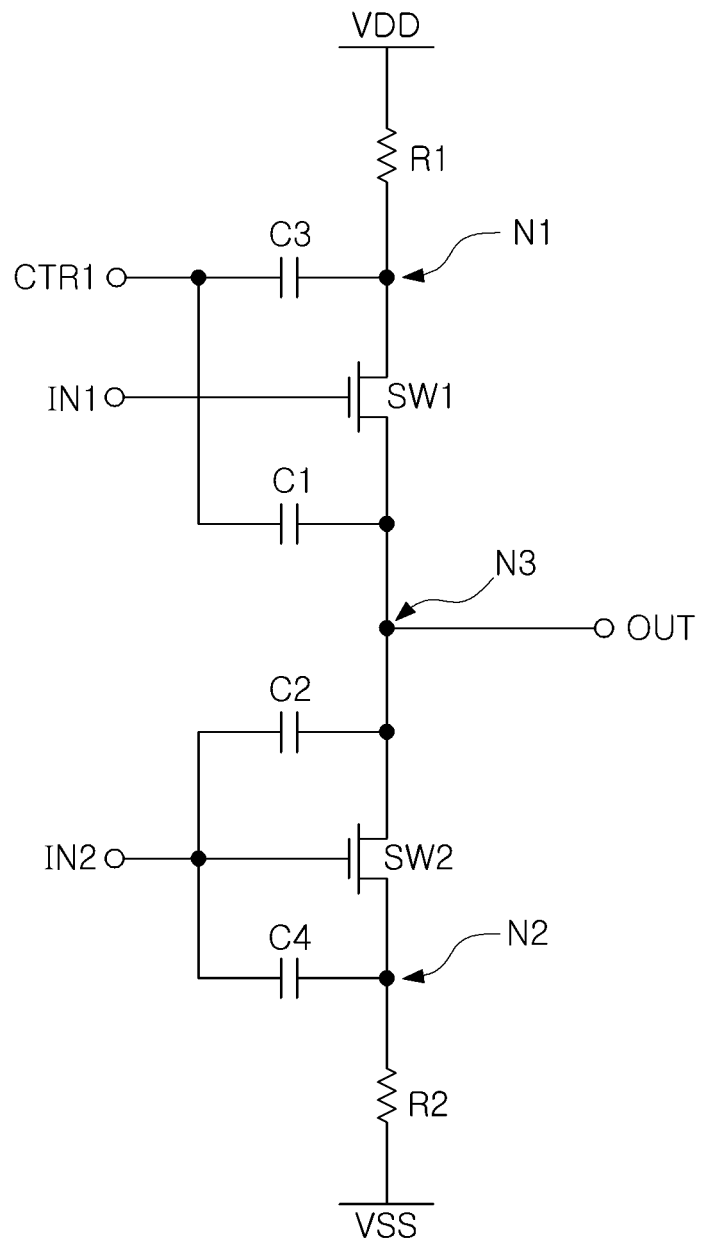
FIGS. 16 and 17 are diagrams illustrating the operation of an interface circuit according to an example embodiment.
Figure 17:
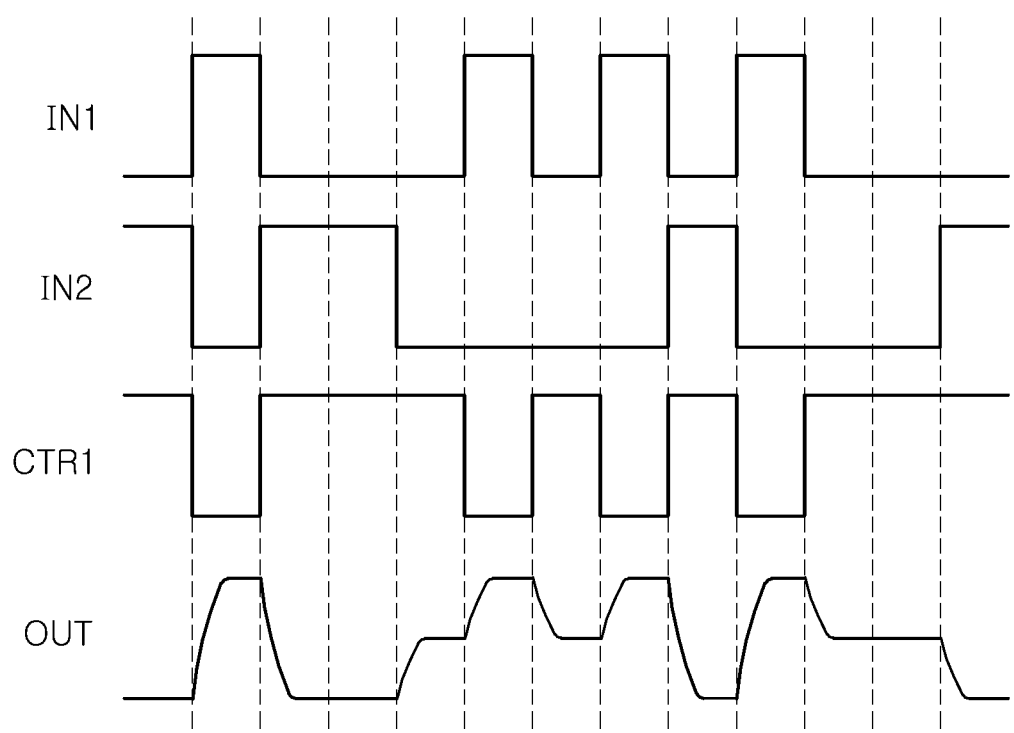

FIGS. 16 and 17 are diagrams provided to illustrate the operation of an interface circuit according to an example embodiment.

In an example embodiment described with reference to FIGS. 16 and 17, the output signal OUT may be a single-ended signal having a high level, a low level, and a middle level. Referring to FIG. 16, the first capacitor C1 and the third capacitor C3 commonly receive the first control signal CTR1, and the second capacitor C2 and the fourth capacitor C4 may commonly receive the second input signal IN2. Accordingly, an equivalent circuit of an interface circuit 160 may be represented as illustrated in FIG. 16.

Since the output signal OUT is a single-ended signal, the relationship between the first input signal IN1, the second input signal IN2, and the output signal OUT may be as described with reference to Table 1 above. Also, referring to FIG. 17, the first input signal IN1 and the first control signal CTR1 may have complementary relationships with each other. Accordingly, when the first switching element SW1 is turned on, the first capacitor C1 and the third capacitor C3 are discharged, and when the first switching element SW1 is turned off, the second capacitor C2 and the fourth capacitor C4 may be charged.

Because the second input signal IN2 is input to the second capacitor C2 and the fourth capacitor C4, when the second switching element SW2 is turned on, the second capacitor C2 and the fourth capacitor C4 are charged, and when the second switching element SW2 is turned off, the second capacitor C2 and the fourth capacitor C4 may be discharged. Therefore, as illustrated in FIG. 17, the slew rate of the output signal OUT may be reduced. As described above, as the slew rate of the output signal OUT decreases, noise components generated in an interface circuit 150, for example, Electromagnetic Interference (EMI) may be reduced.

The example embodiments described with reference to FIGS. 6 to 17 may be descriptions of operations of the interface circuit 100 illustrated in FIG. 5. For example, when the interface circuit 100 according to the example embodiment illustrated in FIG. 5 outputs the output signal OUT using a differential signal method, the interface circuit 100 may be operated to increase the slew rate of the output signal OUT as illustrated in FIG. 6 or FIG. 10. For example, the first input signal IN1 may be input to the interface circuit 100 as the first control signal CTR1 and the second control signal CTR2, and a constant voltage may be input as the third control signal CTR3 and the fourth control signal CTR4, thereby operating the interface circuit 100 as illustrated in FIG. 6. In addition, the interface circuit 100 may be operated as illustrated in FIG. 10 by inputting the first input signal IN1 to the interface circuit 100 as the first to fourth control signals CTR1-CTR4.

In addition, in an example embodiment, when the interface circuit 100 outputs the output signal OUT in a single-ended signal method, the interface circuit 100 may be operated as illustrated in FIG. 8 or FIG. 12, to increase the slew rate of the output signal OUT. In an example, the first input signal IN1 may be input to the interface circuit 100 as the first control signal CTR1, the complementary signal of the second input signal IN2 may be input to the interface circuit 100 as the second control signal CTR2, and a constant voltage may be input as the third control signal CTR3 and the fourth control signal CTR4, thereby operating the interface circuit 100 as illustrated in FIG. 8. Further, the first input signal IN1 may be input to the interface circuit 100 as the first control signal CTR1 and the third control signal CTR3, and the complementary signal of the second input signal IN2 may be input to the interface circuit 100 as the second control signal CTR2 and the fourth control signal CTR4, thereby implementing the interface circuit 100 as illustrated in FIG. 12.

In detail, the interface circuits 110-160 according to the example embodiments described with reference to FIGS. 6 to 17 may be equivalent circuits obtainable by adjusting the first to fourth control signals CTR1-CTR4 in the interface circuit 100 according to the example embodiment illustrated in FIG. 5. Therefore, in an example embodiment, by appropriately selecting the first and second input signals IN1 and IN2 and the first to fourth control signals CTR1-CTR4 in the interface circuit 100 implemented as illustrated in FIG. 5, the interface circuit 100 may be operated in various methods according to the example embodiments described with reference to FIGS. 6 to 17.

As another example, the example embodiments described with reference to FIGS. 6 to 17 may be interface circuits 110-160 implemented as separate circuits from each other. For example, one end of each of the first capacitor C1 and the second capacitor C2 may be physically connected to the gate of the first switching element SW1 to implement the interface circuit 110 as illustrated in FIG. 6. In addition, one end of each of the first capacitor C1 and the third capacitor C3 may be physically connected to the gate of the first switching element SW1, and the second control signal CTR2 which is a complementary signal of the second input signal IN2 may be input to the second capacitor C2 and the fourth capacitor C4, thereby implementing the interface circuit 140 as illustrated in FIG. 12.

Figure 18:
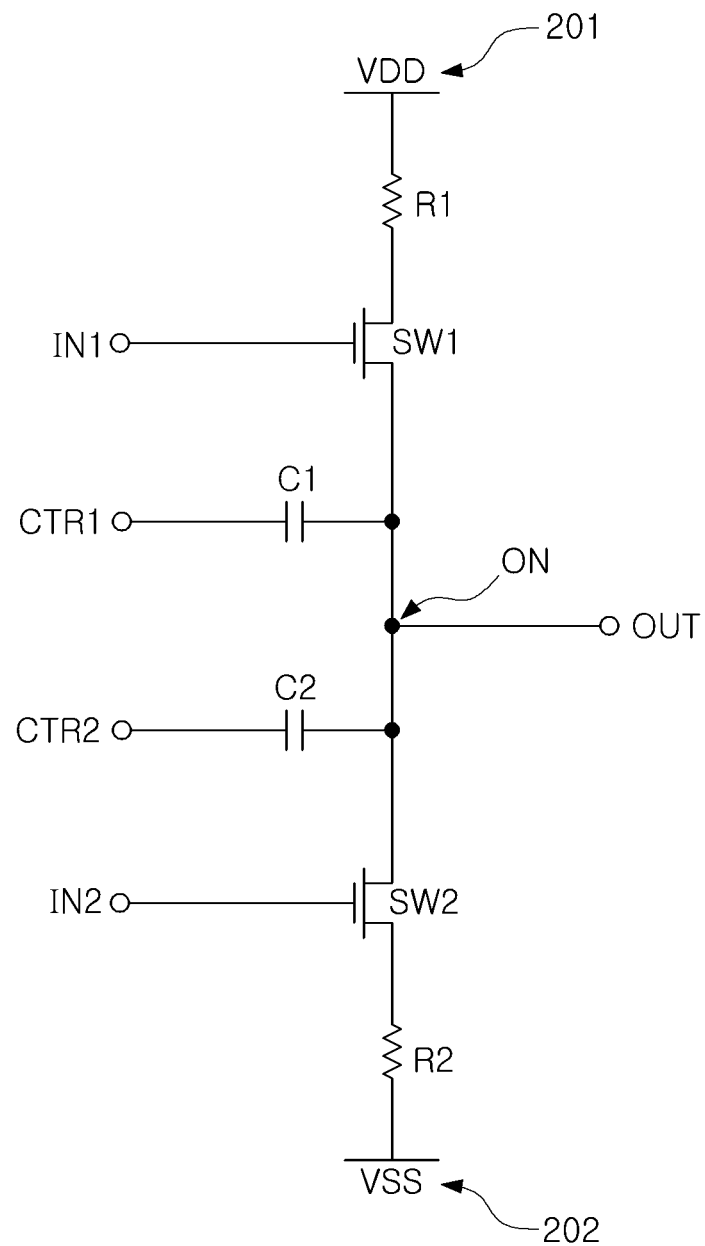
FIG. 18 is a circuit diagram of an interface circuit according to an example embodiment.

FIG. 18 is a circuit diagram of an interface circuit according to an example embodiment.

Referring to FIG. 18, an interface circuit 200 according to an example embodiment includes a first switching element SW1, a second switching element SW2, a first capacitor C1, a second capacitor C2, a first resistor R1, a second resistor R2 and the like. The first switching element SW1 and the second switching element SW2 may be connected to each other in series, between a first power supply node 201 and a second power supply node 202.

The output signal OUT output to an output node ON in the example embodiment illustrated in FIG. 18 may be determined by a first input signal IN1 controlling the first switching element SW1 and a second input signal IN2 controlling the second switching element SW2. For example, when the first switching element SW1 is turned on, the output signal OUT increases, and when the second switching element SW2 is turned on, the output signal may decrease.

The first capacitor C1 and the second capacitor C2 may be connected to the output node ON. The first capacitor C1 may be charged and discharged by the first control signal CTR1, and the second capacitor C2 may be charged and discharged by the second control signal CTR2.

In an example embodiment, the first capacitor C1 and the second capacitor C2 may be implemented as a MOS capacitor or the like. When the first capacitor C1 and the second capacitor C2 are MOS capacitors, the first control signal CTR1 and the second control signal CTR2 may be input to gate terminals of the first capacitor C1 and the second capacitor C2, respectively. In an example embodiment, the first capacitor C1 and the second capacitor C2 may have the same capacitance value. In an example embodiment, the capacitance value of the first capacitor C1 may be different from the capacitance value of the second capacitor C2.

When an interface circuit 200 transmits data using a differential signal method, the first input signal IN1 and the second input signal IN2 may have opposite phases, and the output signal may swing between a high level and a low level. The first input signal IN1 may be a complementary signal of the second input signal IN2. In an example embodiment, when the output signal OUT decreases from a high level to a low level or increases from a low level to a high level, charging and discharging of the first capacitor C1 and the second capacitor C2 may be controlled, thereby increasing or decreasing the slew rate of the output signal OUT.

When the interface circuit 100 transmits data using a single-ended signal method, the first input signal IN1 and the second input signal IN2 may not have entirely opposite phases, and the output signal OUT may have at least one middle level smaller than the high level and larger than the low level in addition to the high level and the low level. For at least some amount of time, the first input signal IN1 and the second input signal IN2 may have the same value.

Even when the interface circuit 200 transmits data using a single-ended signal method, the slew rate of the output signal OUT may be increased or decreased by controlling charging and discharging of the first capacitor C1 and the second capacitor C2. In an example embodiment, at least one of the first capacitor C1 and the second capacitor C2 may be controlled in different manners when the interface circuit 200 operates in a differential signal method and operates in a single-ended signal method. For example, when the interface circuit 200 operates in a differential signal method, the second capacitor C2 may receive the first input signal IN1 as the second control signal CTR2, and when the interface circuit 200 operates in a single-ended signal method, the second capacitor C2 may receive a complementary signal of the second input signal IN2 as the second control signal CTR2.

As described above with reference to FIG. 5, the interface circuit 200 may be defined as a unit circuit, and a plurality of unit circuits may be connected to one output pad that outputs the output signal OUT in an example embodiment of an interface device. For example, one or more first unit circuits and one or more second unit circuits may be connected to one output pad. For example, values of the resistors R1 and R2 and the capacitors C1 and C2 included in the first unit circuit may be the same as or different from values of the resistors R1 and R2 and the capacitors C1 and C2 included in the second unit circuit. In addition, the number of unit circuits operating among the unit circuits connected to each output pad may be changed depending on a method in which the interface device transmits a signal.

Figure 19:
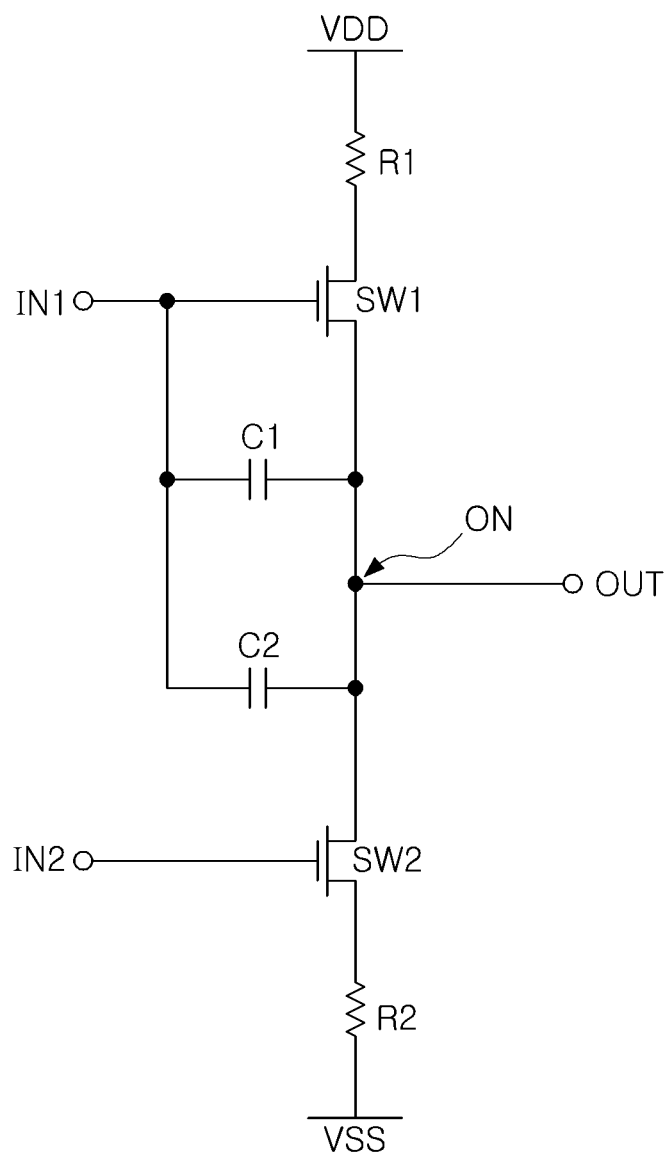
FIGS. 19 and 20 are diagrams illustrating the operation of an interface circuit according to an example embodiment.
Figure 20:
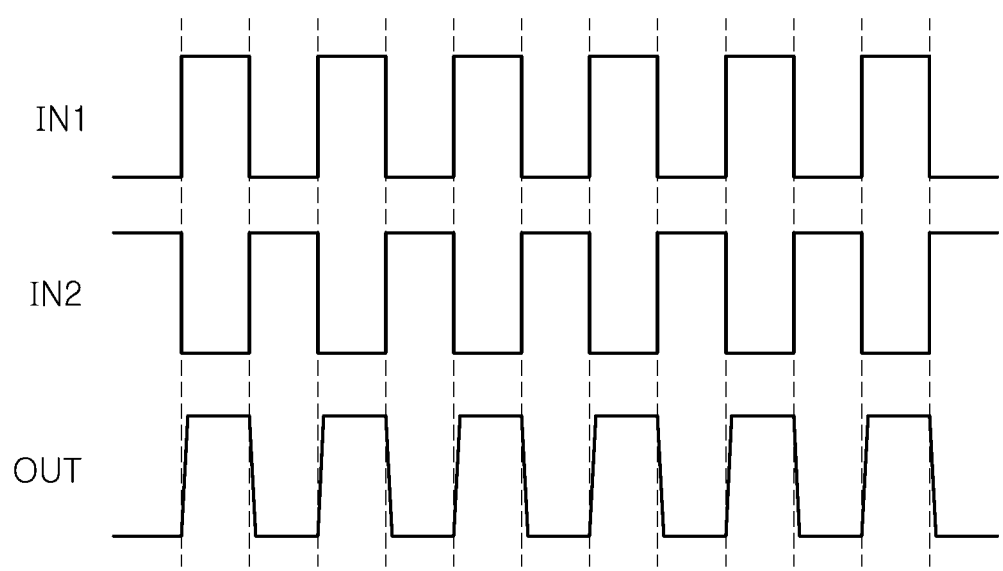

FIGS. 19 and 20 are diagrams provided to illustrate the operation of an interface circuit according to an example embodiment.

In an example embodiment described with reference to FIGS. 19 and 20, an interface circuit 210 may output the output signal OUT using a differential signal method. Therefore, when the first switching element SW1 is turned on and the second switching element SW2 is turned off, the output signal OUT may be increased to a high level, and when the first switching element SW1 is turned off and the second switching element SW2 is turned on, the output signal OUT may be reduced to a low level.

The first capacitor C1 and the second capacitor C2 may be charged and discharged by the first input signal IN1. As an example, the first input signal IN1 may be input to the first capacitor C1 and the second capacitor C2 as the first control signal and the second control signal. Therefore, an equivalent circuit of the interface circuit 210 may be represented as illustrated in FIG. 19.

Referring to FIG. 20, when the first switching element SW1 is turned on by the first input signal IN1, the second switching element SW2 may be turned off by the second input signal IN2. Also, when the first switching element SW1 is turned on, the first capacitor C1 and the second capacitor C2 may be charged. As the first capacitor C1 and the second capacitor C2 are charged, the output signal OUT may rapidly increase from a low level to a high level.

In addition, when the first switching element SW1 is turned off by the first input signal IN1 and the second switching element SW2 is turned on by the second input signal IN2, the output signal OUT may be reduced from high level to low level. At this time, the first capacitor C1 and the second capacitor C2 may be discharged by the first input signal IN1, and the output signal OUT may rapidly decrease from a high level to a low level. Therefore, the slew rate of the output signal OUT may be increased.

Figure 21:
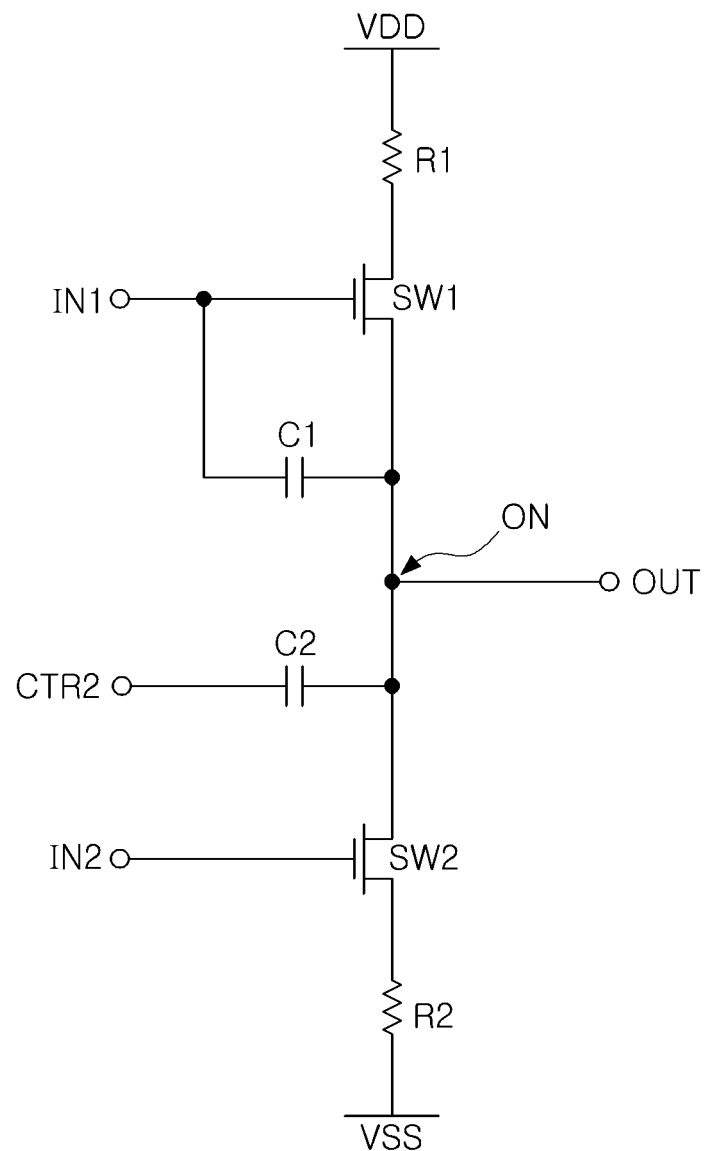
FIGS. 21 and 22 are diagrams illustrating the operation of an interface circuit according to an example embodiment.
Figure 22:
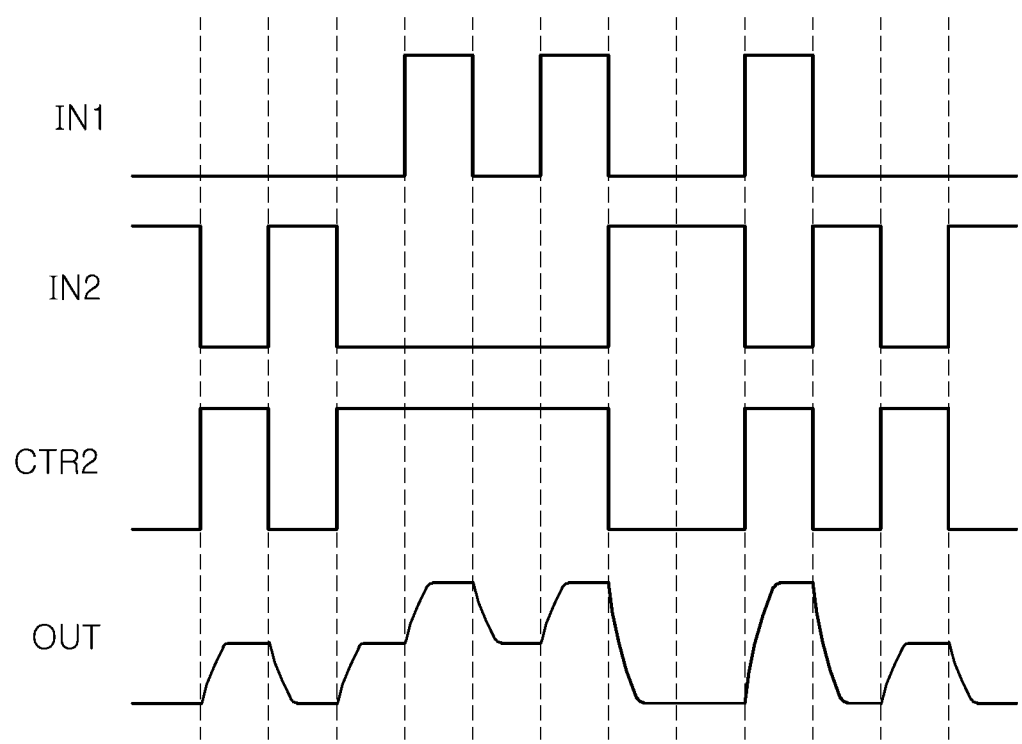

FIGS. 21 and 22 are views provided to illustrate the operation of an interface circuit according to an example embodiment.

In an example embodiment described with reference to FIGS. 21 and 22, an interface circuit 220 may operate using a single-ended signal method. Referring to FIG. 22, when the first switching element SW1 is turned on and the second switching element SW2 is turned off, the output signal OUT may increase from a low level to a high level, and when the first switching element SW1 is turned off and the second switching element SW2 is turned on, the output signal OUT may decrease from a high level to a low level. Also, as one of the first switching element SW1 and the second switching element SW2 is turned on or off, the output signal OUT may have a middle level between a high level and a low level. The output signal OUT may be determined by the first input signal IN1 and the second input signal IN2 as illustrated in Table 1 described above.

The first capacitor C1 in the interface circuit 220 may be charged and discharged by the first input signal IN1. In detail, the first control signal input to the first capacitor C1 may be the same as the first input signal IN1. A separate second control signal CTR2 may be input to the second capacitor C2. Accordingly, an equivalent circuit of the interface circuit 220 may be represented as illustrated in FIG. 21. For example, the second control signal CTR2 may have a complementary relationship with the second input signal IN2. The first capacitor C1 may be charged and discharged with the first input signal IN1, and the second capacitor C2 may be charged and discharged with the complementary signal of the second input signal IN2, thereby increasing the slew rate of the output signal OUT as illustrated in FIG. 22.

The example embodiments described with reference to FIGS. 19 to 22 may be descriptions of operations of the interface circuit 200 illustrated in FIG. 18. In detail, each of the interface circuit 210 illustrated in FIG. 19 and the interface circuit 220 illustrated in FIG. 21 may be an equivalent circuit based on the operation of the interface circuit 200 illustrated in FIG. 18.

Also, in a manner different from the description with reference to FIGS. 19 to 22, the slew rate of the output signal OUT may be reduced by appropriately selecting the first control signal CTR1 and the second control signal CTR2. For example, when the output signal OUT is a differential signal, the second input signal IN2 may be selected as the first control signal CTR1 and the second control signal CTR2, thereby reducing the slew rate of the output signal OUT. When the output signal OUT is a single-ended signal, the complementary signal of the first input signal IN1 may be selected as the first control signal CTR1, and the second input signal IN2 is selected as the second control signal CTR2, thereby reducing the slew rate of the output signal OUT. By reducing the slew rate of the output signal OUT, noise generated in the interface circuit 200 may be reduced and power consumption may be reduced.

Figure 23:
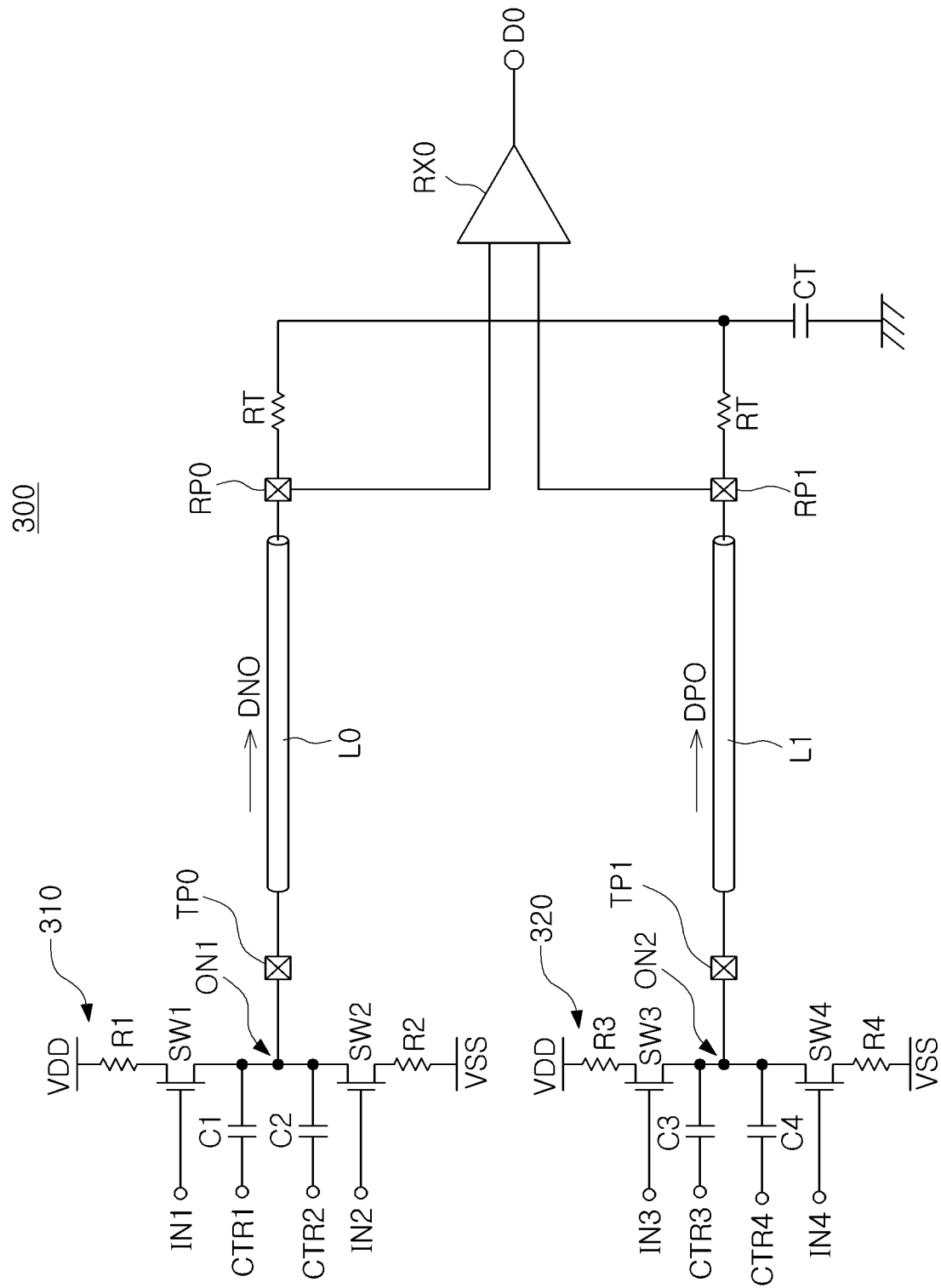
FIG. 23 is a schematic diagram illustrating an interface device according to an example embodiment.
Figure 24:
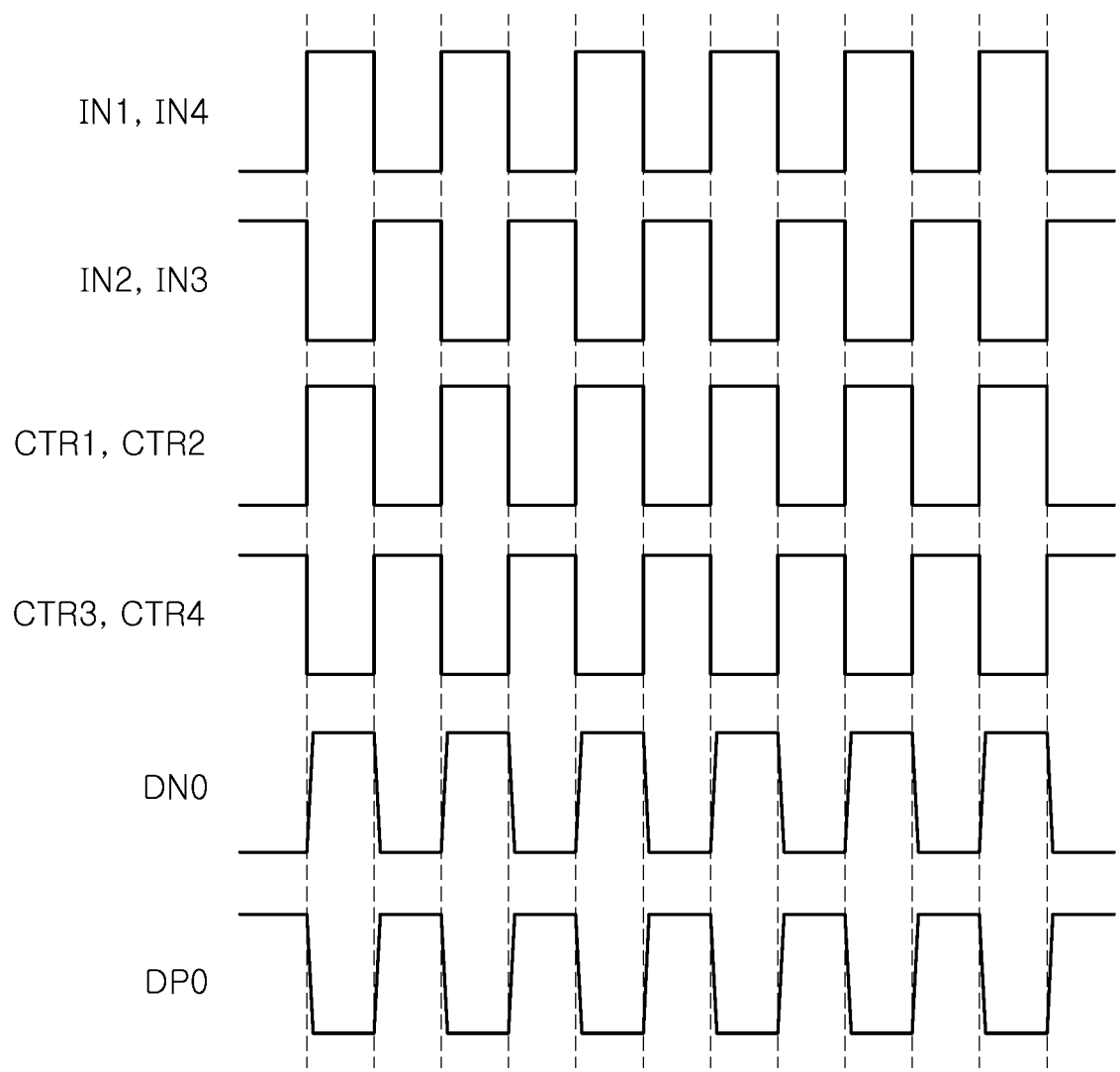
FIGS. 24 and 25 are diagrams illustrating the operation of an interface device according to an example embodiment.
Figure 25:
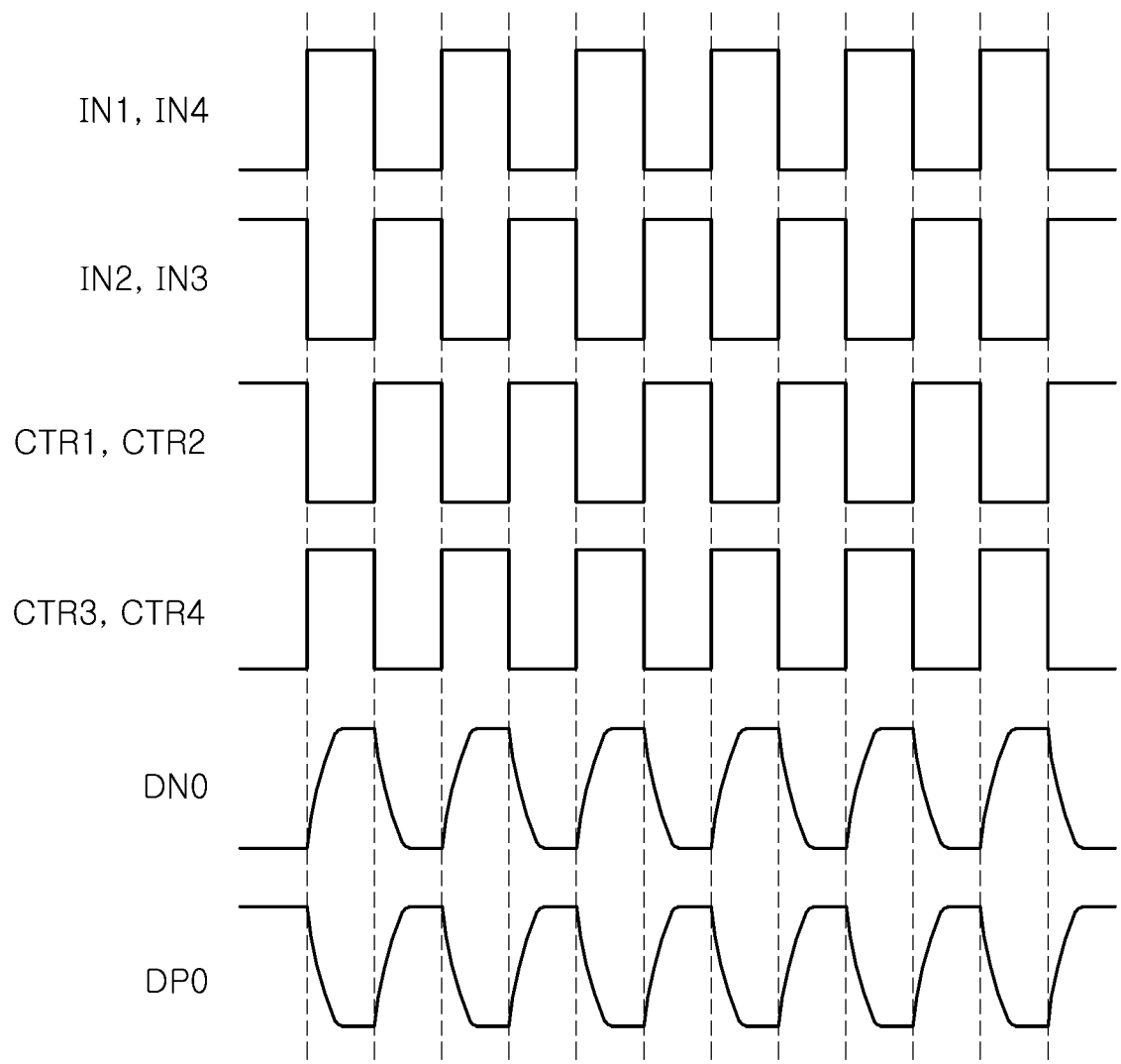

FIG. 23 is a view illustrating an interface device according to an example embodiment. FIGS. 24 and 25 are views provided to illustrate the operation of an interface device according to an example embodiment.

Referring to FIG. 23, an interface device 300 according to an example embodiment may operate using a differential signal method. The interface device 300 may include a first circuit 310 outputting a first output signal DN0, and a second circuit 320 outputting a second output signal DP0. The first output signal DN0 and the second output signal DP0 may have opposite phases, and may be transmitted to receiving pads RP0 and RP1 from output pads TP0 and TP1 through a first data lane L0 and a second data lane L1. A termination circuit including a termination resistor RT and a termination capacitor CT may be connected to each of the first receiving pad RP0 and the second receiving pad RP1. A receiver RX0 may generate received data D0 using the first output signal DN0 and the second output signal DP0.

The first circuit 310 and the second circuit 320 may have the same structure. The first circuit 310 may include a first switching element SW1, a second switching element SW2, a first resistor R1, a second resistor R2, a first capacitor C1, a second capacitor C2, and the like. The operations of the first switching element SW1 and the second switching element SW2 may be controlled by the first input signal IN1 and the second input signal IN2, respectively, and the first output signal DN0 may be output through the output node ON1 and the output pad TP0.

The second circuit 320 may include a third switching element SW3, a fourth switching element SW4, a third resistor R3, a fourth resistor R4, a third capacitor C3, a fourth capacitor C4, and the like. The operations of the third switching element SW3 and the fourth switching element SW4 may be controlled by the third input signal IN3 and the fourth input signal IN4, respectively, and the second output signal DP0 may be output through the output node ON2 and the output pad TP1.

In an example embodiment different from the example embodiment illustrated in FIG. 23, the first circuit 310 may further include a third capacitor C3 and a fourth capacitor C4. For example, the third capacitor C3 may be connected between the first resistor R1 and the first switching element SW1 to receive a constant voltage or a separate control signal, and the fourth capacitor C4 is connected between the second resistor R2 and the second switching element SW2 to receive a constant voltage or a separate control signal.

Hereinafter, the operation of the interface device 300 will be described with reference to FIGS. 24 and 25 together.

FIG. 24 is a waveform diagram provided to illustrate example embodiment in which the slew rates of the first output signal OUT1 and the second output signal OUT2 are increased. Referring to FIG. 24, the first input signal IN1 and the second input signal IN2 may have opposite phases, and the third input signal IN3 and the fourth input signal IN4 may have opposite phases. The first input signal IN1 and the fourth input signal IN4 may have the same phase. Therefore, the first output signal OUT1 and the second output signal OUT2 may have opposite phases.

For example, the first input signal IN1 may be selected as the first control signal CTR1 and the second control signal CTR2. Accordingly, when the first switching element SW1 is turned on, the first capacitor C1 is charged, and the first output signal DN0 may rapidly increase. In addition, when the second switching element SW2 is turned on, the second capacitor C2 is discharged, and the first output signal DN0 may rapidly decrease.

In addition, the third input signal IN3 may be selected as the third control signal CTR3 and the fourth control signal CTR4 input to the second circuit 120. Therefore, when the third switching element SW3 is turned on in the second circuit 320, the second output signal DP0 increases rapidly, and when the fourth switching element SW4 is turned on, the second output signal DP0 may decrease rapidly. As described above, by controlling the capacitors C1-C4, the eye margin may be increased as illustrated in FIG. 24. In addition, a time when the received data D0 output by the receiver RX0 has a high level or a low level may be sufficiently secured, and the receiving side may accurately detect the received data D0.

FIG. 25 may be a waveform diagram provided to illustrate an example embodiment of reducing the slew rate of the first output signal OUT1 and the second output signal OUT2. Referring to FIG. 25, input signals IN1-IN4 may be the same as described with reference to FIG. 24.

For example, the second input signal IN2 may be selected as the first control signal CTR1 and the second control signal CTR2 input to the first circuit 310. When the first switching element SW1 is turned on, the first capacitor C1 is discharged, and the first output signal DN0 may slowly increase. In addition, when the second switching element SW2 is turned on, the second capacitor C2 is charged, and the first output signal DN0 may slowly decrease.

Also, the fourth input signal IN4 may be selected as the third control signal CTR3 and the fourth control signal CTR4 input to the second circuit 320. Therefore, when the third switching element SW3 is turned on, the second output signal DP0 increases slowly, and when the fourth switching element SW4 is turned on, the second output signal DP0 slowly decreases. Therefore, as illustrated in FIG. 25, the eye margin and slew rate of the output signals DN0 and DP0 may be reduced.

As a result, the interface device 300 according to an example embodiment may intentionally increase or decrease the slew rate of the output signals DN0 and DP0. When the high-speed data communication is not required by intentionally reducing the slew rate as described above, the interference of the operation of the interface device 300 to the performance of other adjacent components, such as an RF module, a GPS module, etc. may be significantly reduced.

Figure 26:
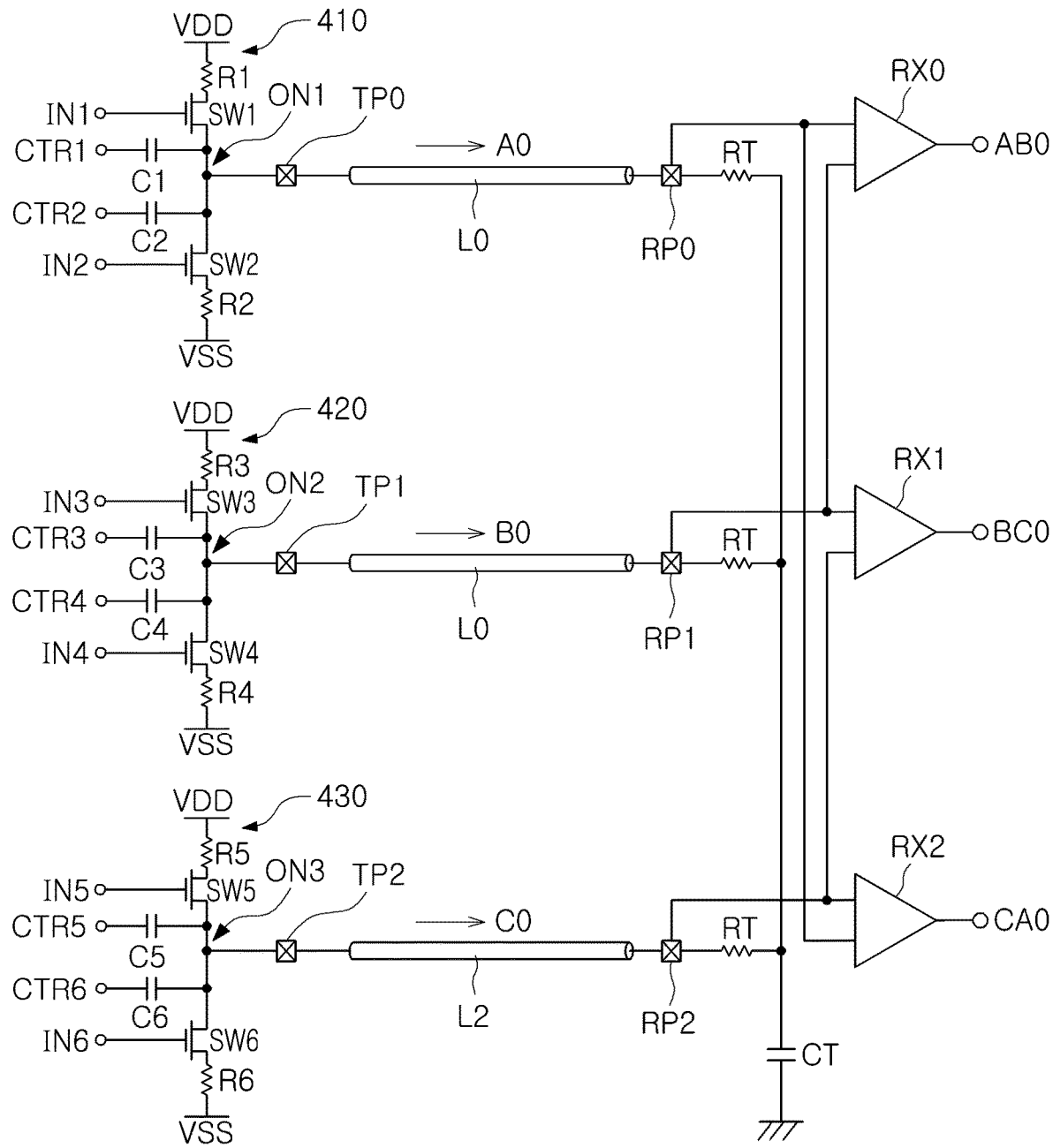
FIG. 26 is a diagram schematically illustrating an interface device according to an example embodiment.

FIG. 26 is a view illustrating an interface device according to an example embodiment. FIGS. 27 to 30 are views provided to illustrate the operation of the interface device according to an example embodiment.

Figure 27:
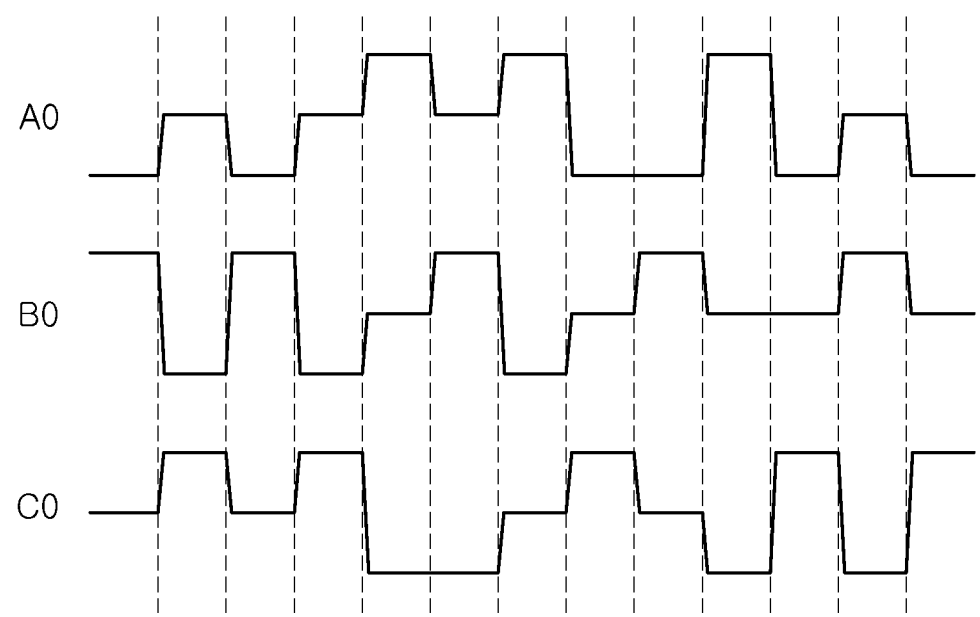
FIGS. 27 to 30 are diagrams illustrating the operation of an interface device according to an example embodiment.

Referring first to FIG. 27, an interface device 400 according to an example embodiment may include a first circuit 410 outputting a first output signal A0, a second circuit 420 outputting a second output signal B0, and a third circuit 430 outputting a third output signal C0. The interface device 400 according to the example embodiment illustrated in FIG. 27 may support communication according to the C-Phy interface according to the MIN standard. The first to third output signals A0-C0 may have any one of a high level, a low level, and a middle level, and the first to third output signals A0-C0 may not have the same level.

The first output signal A0 may be input to the first receiving pad RP0 along a first data lane L0, the second output signal B0 may be input to the second receiving pad RP1 along a second data lane L1, and the third output signal C0 may be input to the third receiving pad RP2 through a third data lane L2. A termination circuit may be connected to each of the receiving pads RP0 to RP2, and the termination circuit may include a termination resistor RT and a termination capacitor CT.

The first to third receivers RX0 to RX2 may generate first to third received data AB0, BC0, and CA0 using the first to third output signals A0 to C0, respectively. The first receiver RX0 may generate the first received data AB0 using the difference between the first output signal A0 and the second output signal B0, and the second receiver RX1 may generate the second received data BC0 using the difference between the second output signal B0 and the third output signal C0. The third receiver RX2 may generate the third received data CA0 by using the difference between the third output signal C0 and the first output signal A0. In an example embodiment, the receiving side may convert the first to third received data AB0, BC0 and CA0 into state information having three bits, and may generate symbol information using a change in state information.

The first circuit 410, the second circuit 420, and the third circuit 430 may have the same structure. In an example embodiment, first circuit 410 may include the first switching element SW1, the second switching element SW2, the first resistor R1, the second resistor R2, the first capacitor C1, the second capacitor C2, and the like. The first capacitor C1 and the second capacitor C2 may be connected to the output node ON1. The first capacitor C1 may be charged and discharged by the first control signal CTR1, and the second capacitor C2 may be charged and discharged by the second control signal CTR2.

In an example embodiment, second circuit 420 may include the third switching element SW3, the fourth switching element SW4, the third resistor R3, the fourth resistor R4, the third capacitor C3, the fourth capacitor C4, and the like. The third capacitor C3 and the fourth capacitor C4 may be connected to the output node ON2. The third capacitor C3 may be charged and discharged by the third control signal CTR3, and the fourth capacitor C4 may be charged and discharged by the fourth control signal CTR4.

In an example embodiment, third circuit 430 may include the fifth switching element SW5, the sixth switching element SW6, the fifth resistor R5, the sixth resistor R6, the fifth capacitor C5, the sixth capacitor C6, and the like. The fifth capacitor C5 and the sixth capacitor C6 may be connected to the output node ON3. The fifth capacitor C5 may be charged and discharged by the fifth control signal CTR5, and the sixth capacitor C6 may be charged and discharged by the sixth control signal CTR6.

Hereinafter, the operation of the interface device 400 will be described with reference to FIGS. 27 to 30 together.

Figure 28:
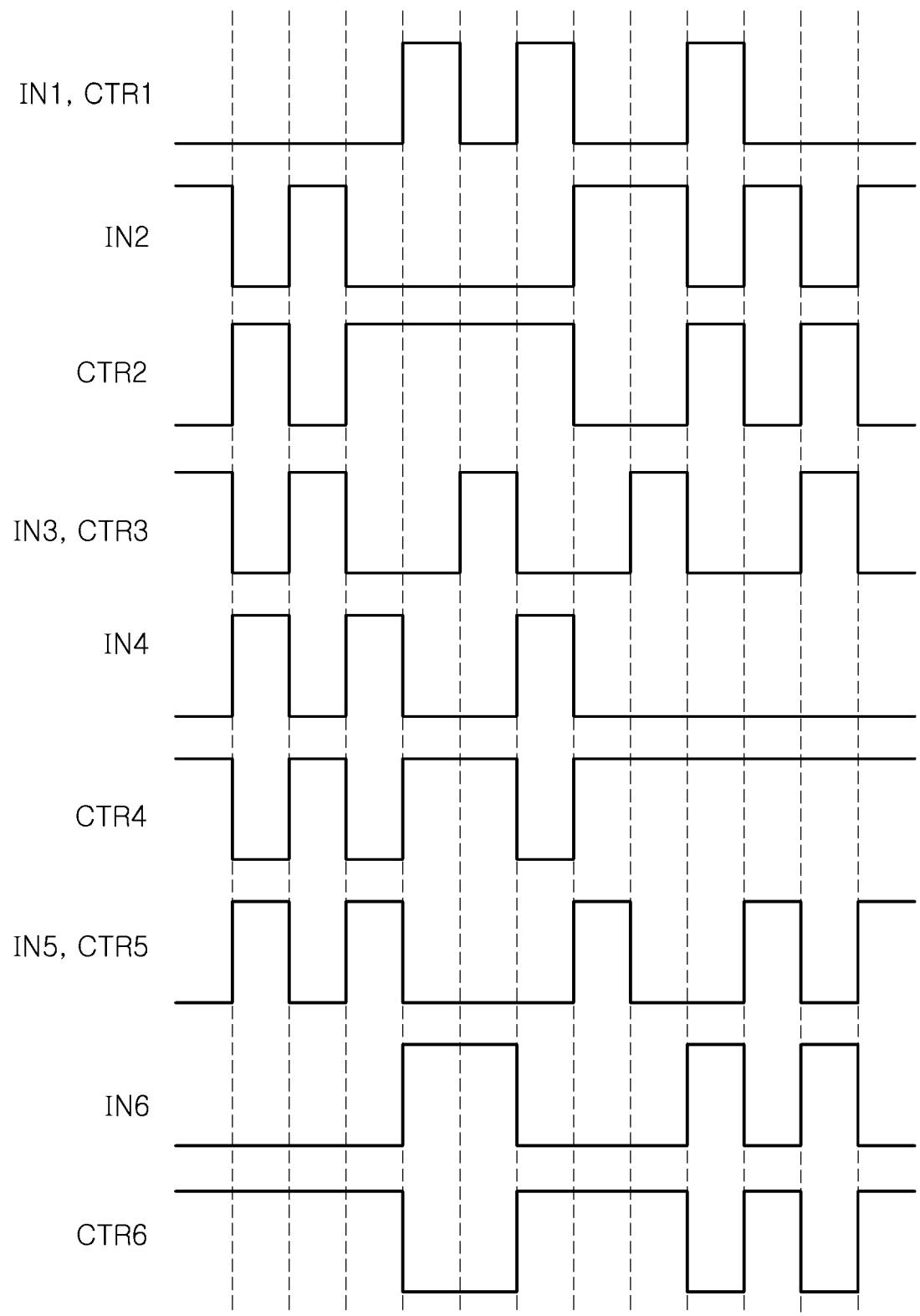

FIGS. 27 and 28 may correspond to an operation embodiment in which the slew rate of the first to third output signals A0-C0 may increase. Referring to FIG. 27, the magnitude of each of the first to third output signals A0-C0 may be determined as one of a high level, a low level, and a middle level, and the first to third output signals A0-C0 may not have the same level simultaneously.

FIG. 28 is a view illustrating input signals IN1-IN6 and control signals CTR1-CTR6 corresponding to the first to third output signals A0-C0 illustrated in FIG. 27. Referring to the first circuit 410 as an example, the first control signal CTR1 and the first input signal IN1 may be the same signal, and the second control signal CTR2 may be a signal complementary of the second input signal IN2. By selecting the first and second control signals CTR1 and CTR2 as described above, the slew rate of the first output signal A0 may be increased. Similarly, in the second circuit 420, the third control signal CTR3 may be the same signal as the third input signal IN3, and the fourth control signal CTR4 may be a complementary signal of the fourth input signal IN4, and in the third circuit 430, the fifth control signal CTR5 may be the same signal as the fifth input signal IN5, and the sixth control signal CTR6 may be a complementary signal of the sixth input signal IN6.

Figure 29:
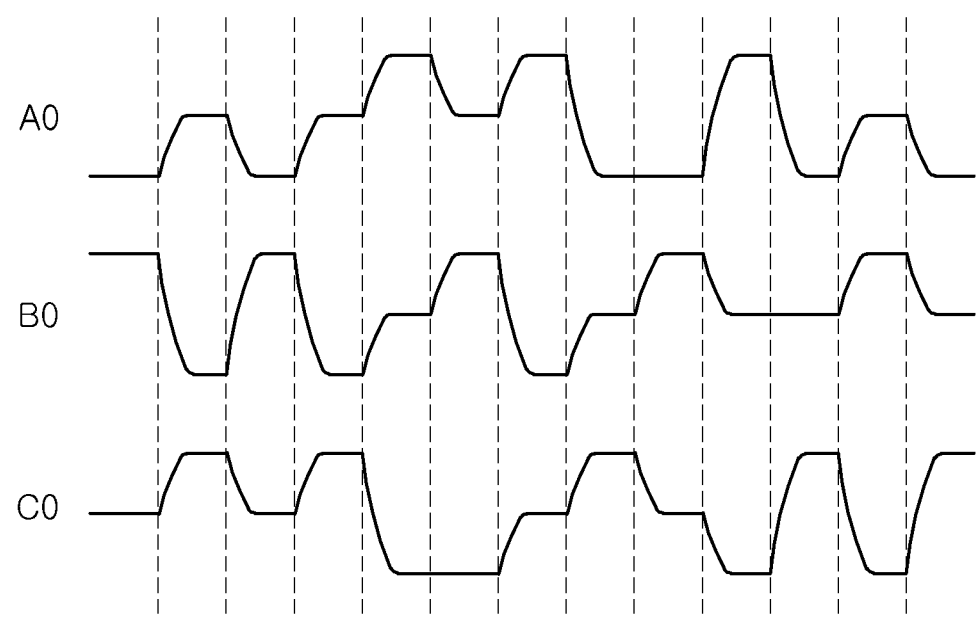
Figure 30:
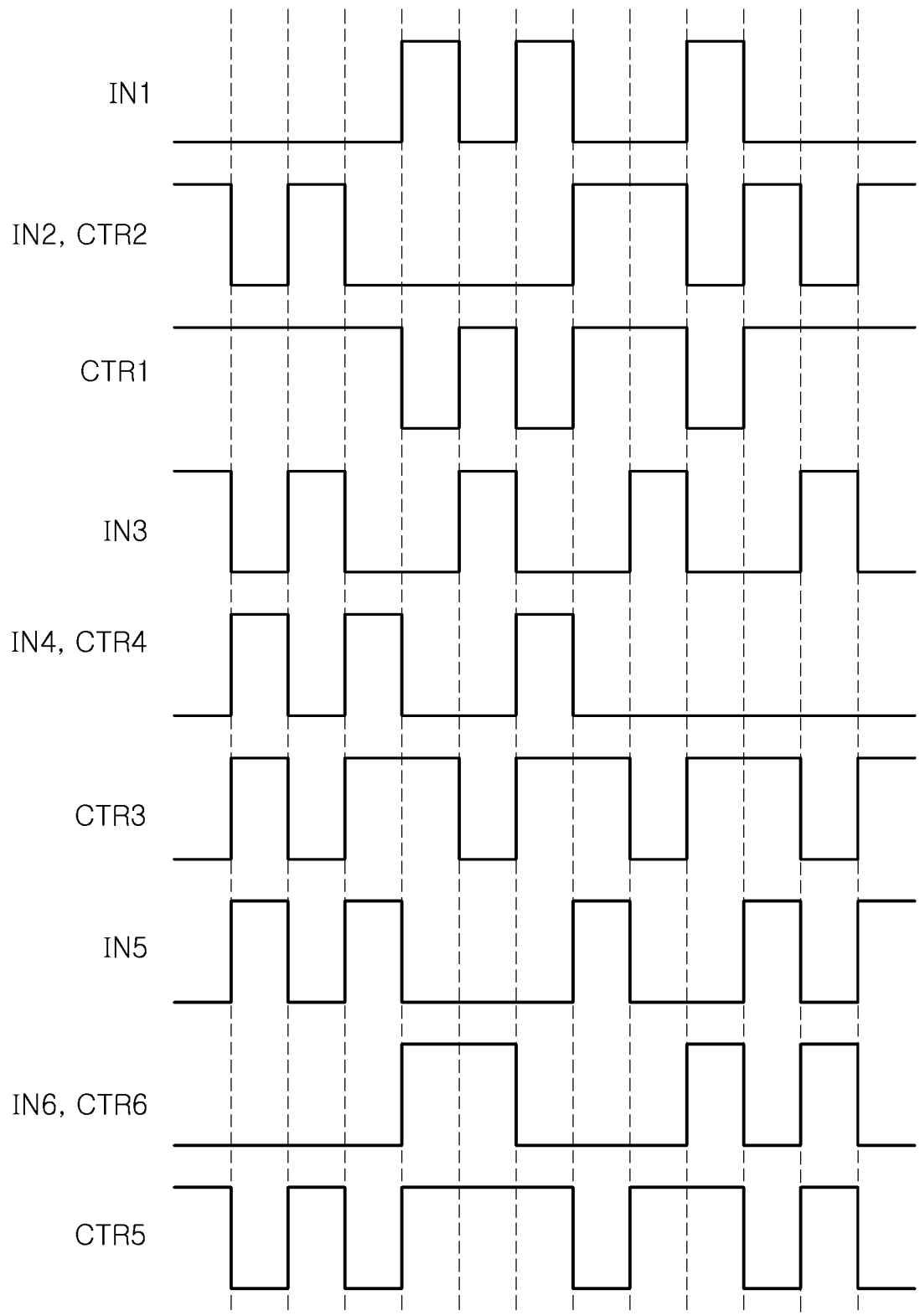

FIGS. 29 and 30 may correspond to an operation embodiment in which the slew rate of the first to third output signals A0-C0 may decrease. Referring to FIG. 29, the magnitude of each of the first to third output signals A0-C0 is determined as one of a high level, a low level, and a middle level, and the first to third output signals A0-C0 may not have the same level simultaneously.

FIG. 30 is a view illustrating input signals IN1-IN6 and control signals CTR1-CTR6 corresponding to the first to third output signals A0-C0 illustrated in FIG. 29. Referring to the first circuit 410 as an example, the first control signal CTR1 may be a complementary signal of the first input signal IN1, and the second control signal CTR2 may be equal to the second input signal IN2. As such, by selecting the first and second control signals CTR1 and CTR2, the slew rate of the first output signal A0 may be reduced. Similarly, in the second circuit 420, the third control signal CTR3 may be a complementary signal of the third input signal IN3, and the fourth control signal CTR4 may be equal to the fourth input signal IN4, and in the third circuit 430, the fifth control signal CTR5 may be a complementary signal of the fifth input signal IN5, and the sixth control signal CTR6 may be equal to the sixth input signal IN6.

As described with reference to FIGS. 27 and 28, the slew rate of the first to third output signals A0-C0 may be increased to improve the operation performance of the interface device 400. As described with reference to FIGS. 29 and 30, the slew rate of the first to third output signals A0-C0 may be reduced to improve noise characteristics of the interface device 400 and lower power consumption.

Figure 31:
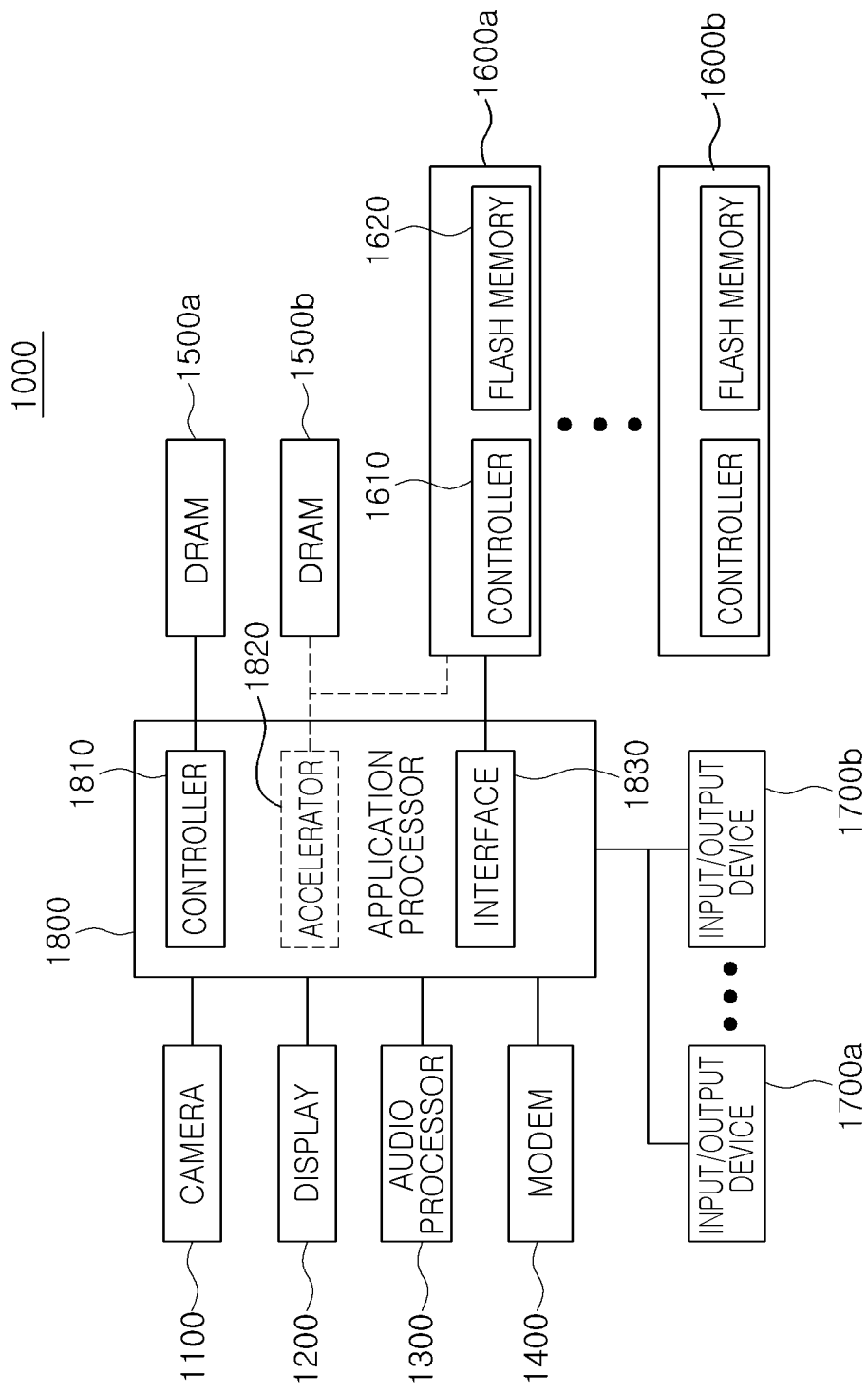
FIG. 31 is a schematic block diagram of an electronic device including an interface circuit according to an example embodiment.

FIG. 31 is a block diagram of a mobile system including an interface circuit according to an example embodiment.

Referring to FIG. 31, a mobile system 1000 may include a camera 1100, a display 1200, an audio processor 1300, a modem 1400, DRAMs 1500a and 1500b, flash memory devices 1600a and 1600b, and I/O devices 1700a and 1700b, and an application processor (hereinafter referred to as "AP") 1800.

The mobile system 1000 may be implemented by a laptop computer, a portable terminal, a smart phone, a tablet PC, a wearable device, a healthcare device, or an Internet-of-Things (IoT) device. Also, the mobile system 1000 may be implemented by a server or a personal computer.

The camera 1100 may capture a still image or a video according to user control. The mobile system 1000 may acquire specific information by using a still image/video captured by the camera 1100 or may convert the still image/video into other types of data such as text and store the converted data. In an example embodiment, the mobile system 1000 may recognize a character string included in a still image/video photographed by the camera 1100 and provide a text or audio translation corresponding to the character string. As such, the field of use of the camera 1100 in the mobile system 1000 is increasingly diversified. In an example embodiment, the camera 1100 may transmit data such as a still image/video to the AP 1800 according to a D-Phy or C-Phy interface based on the MIPI standard.

The display 1200 may be implemented in various forms such as a liquid crystal display (LCD), an organic light emitting diodes (OLED) display, active-matrix organic light-emitting diode (AM-OLED), plasma display panel (PDP), field emission display (FED), or electronic paper. In an example embodiment, the display 1200 may also be used as an input device of the mobile system 1000 by providing a touch screen function. In addition, the display 1200 may be provided integrally with a fingerprint sensor or the like to provide a security function of the mobile system 1000. In an example embodiment, the AP 1800 may transmit image data to be displayed on the display 1200 according to a D-Phy or C-Phy interface based on the MIPI standard to the display 1200.

The interface device described with reference to the example embodiments may be applied to communication between the AP 1800 and the display 1200 and communication between the AP 1800 and the camera 1100. At least one of the AP 1800, the display 1200, and the camera 1100 appropriately selects a control signal for charging and discharging a capacitor included in the interface device as required, and therefore, the slew rate of an output signal output by the interface device may be increased or decreased.

For example, by increasing the slew rate of the output signal output by the interface device, the data transmission speed between the AP 1800 and the display 1200 and/or between the AP 1800 and the camera 1100 may be increased and noise characteristics may be improved. In addition, by reducing the slew rate of the output signal output by the interface device, the influence of the communication between the AP 1800 and the display 1200 and/or the communication between the AP 1800 and the camera 1100 on other components may be significantly reduced, and power consumption may be decreased.

The audio processor 1300 may process audio data stored in the flash memory devices 1600a and 1600b or audio data included in contents received externally through the modem 1400 or the I/O devices 1700a and 1700b. For example, the audio processor 1300 may perform various processes such as coding/decoding, amplification, and noise filtering for audio data.

The modem 1400 modulates and transmits signals to transmit/receive wired/wireless data, while demodulating signals received from the outside to restore the original signal. The I/O devices 1700a and 1700b are devices that provide digital input and output, and may include a port that may be connected to an external recording medium, an input device such as touch screens or mechanical button keys, an output device capable of outputting vibrations in a haptic way, etc., and the like. In some examples, the I/O devices 1700a and 1700b may be connected to an external recording medium through ports such as USB, lightning cable, SD card, micro SD card, DVD, network adapter, or the like.

The AP 1800 may control the overall operation of the mobile system 1000. In detail, the AP 1800 may control the display 1200 such that a portion of the contents stored in the flash memory devices 1600a and 1600b is displayed on the screen. Also, when a user input is received through the I/O devices 1700a and 1700b, the AP 1800 may perform a control operation corresponding to the user input.

The AP 1800 may be provided as a system-on-chip (SoC) driving an application program, an operating system (OS), and the like. In addition, the AP 1800 may be included in other devices included in the mobile system 1000, for example, in the DRAM 1500a, a flash memory 1620, and/or a memory controller 1610 and in one semiconductor package. For example, in the form of a package such as Package on Package (PoP), Ball Grid Arrays (BGAs), Chip Scale Packages (CSPs), System In Package (SIP), Multi Chip Package (MCP), Wafer-level Fabricated Package (WFP), Wafer-Level Processed Stack Package (WSP) or the like, at least one device different from the AP 1800 may be provided. The kernel of the operating system running on the AP 1800 may include an input/output scheduler and device drivers for controlling the flash memory devices 1600a and 1600b. The device driver may control the access performance of the flash memory devices 1600a and 1600b by referring to the number of synchronous queues managed by the I/O scheduler, or may control the CPU mode inside the SoC, Dynamic Voltage and Frequency Scaling (DVFS) level, etc.

In an example embodiment, the AP 1800 may include a processor block that executes an operation or drives an application program and/or an operating system, and various other peripheral components connected through a processor block and a system bus. Peripheral components may include a memory controller, internal memory, power management block, error detection block, and monitoring block. The processor block may include one or more cores, and when a plurality of cores are included in the processor block, each of the cores includes a cache memory, and a common cache shared by the cores may be included in the processor block.

In an example embodiment, the AP 1800 may include an accelerator block 1820 that is a dedicated circuit for AI data computation. In an example embodiment, according to example embodiments, a separate accelerator chip may be provided separately from the AP 1800, and a DRAM 1500b may be additionally connected to the accelerator block 1820 or the accelerator chip. The accelerator block 1820 is a function block that professionally performs specific functions of the AP 1800, and includes a Graphics Processing Unit (GPU) that is a functional block that professionally performs graphic data processing, a Neural Processing Unit (NPU) which is a block for professionally performing AI calculation and inference (Inference), and a Data Processing Unit (DPU) that is a block that specializes in data transmission.

According to an example embodiment, the mobile system 1000 may include a plurality of DRAMs 1500a and 1500b. In an example embodiment, the AP 1800 may include a controller 1810 for controlling the DRAMs 1500a and 1500b, and the DRAM 1500a may be directly connected to the AP 1800.

The AP 1800 controls DRAM by setting commands and mode register sets (MRS) conforming to JEDEC standard specifications, or may communicate by establishing specifications and functions such as low voltage/high speed/reliability required by the mobile system 1000 and DRAM interface protocol for CRC/ECC. For example, the AP 1800 may communicate with the DRAM 1500a through an interface conforming to JEDEC standard standards such as LPDDR4 and LPDDR5. In an example embodiment, the AP 1800 may set a new DRAM interface protocol to control the DRAM 1500b for the accelerator in which the accelerator chip provided separately from the accelerator block 1820 or the AP 1800 has a higher bandwidth than the DRAM 1500a.

Although only DRAMs 1500a and 1500b are illustrated in FIG. 31, the configuration of the mobile system 1000 is not necessarily limited to this type. For example, depending on the bandwidth, response speed, and voltage conditions of the AP 1800 or the accelerator block 1820, other memories rather than the DRAMs 1500a and 2500b may also be included in the mobile system 1000. In an example, the controller 1810 and/or the accelerator block 1820 may control various memories such as PRAM, SRAM, MRAM, RRAM, FRAM, Hybrid RAM, and the like. The DRAMs 1500a and 2500b have relatively low latency and high bandwidth than the I/O devices 1700a and 1700b or the flash memory devices 1600a and 1600b. The DRAMs 1500a and 2500b may be initialized at the power-on time point of the mobile system 1000, and when the operating system and application data are loaded, the DRAMs 1500a and 2500b may be used as temporary storage locations for the operating system and application data or as execution spaces for various software codes.

In the DRAMs 1500a and 1500b, addition/subtraction/multiplication/dividing arithmetic operations and vector operations, address operations, or FFT operations data may be stored. In another embodiment, the DRAMs 1500a and 1500b may be provided as a processing-in-memory (PIM) equipped with a calculation function. For example, a function for performing a function used for inference in the DRAMs 1500a and 1500b may be performed. In this case, the inference may be performed in a deep learning algorithm using an artificial neural network. The deep learning algorithm may include a training operation of training a model through various data and an inference operation of recognizing data with the trained model. For example, the function used for the inference may include a hyperbolic tangent function, a sigmoid function, and a rectified linear unit (ReLU) function.

As an example embodiment, an image captured by the user through the camera 1100 may be signal-processed and stored in the DRAM 1500b, and the accelerator block 1820 or accelerator chip may perform AI data operation of recognizing data using data stored in the DRAM 1500b and the function used for inference.

According to an example embodiment, the mobile system 1000 may include a plurality of storage or a plurality of flash memory devices 1600a and 1600b having a larger capacity than the DRAMs 1500a and 1500b. The flash memory devices 1600a and 1600b may include the memory controller 1610 and the flash memory 1620. The memory controller 1610 receives control commands and data from the AP 1800, writes data to the flash memory 1620 in response to the control command, or reads data stored in the flash memory 1620 to access the AP 1800 and may transmit the data to the AP 1800.

According to an example embodiment, the accelerator block 1820 or the accelerator chip may perform training operations and AI data calculation using the flash memory devices 1600a and 1600b. In an example embodiment, operation logic capable of executing a predetermined operation inside the flash memory devices 1600a and 1600b may be implemented in the memory controller 1610, and the operation logic may execute at least a portion of the training operations and the operation of the inference AI data performed by the AP 1800 and/or the accelerator block 1820, in place, using the data stored in the flash memory 1620.

In an example embodiment, the AP 1800 may include an interface 1830, and accordingly, the flash memory devices 1600a and 1600b may be directly connected to the AP 1800. For example, the AP 1800 may be implemented as an SoC, the flash memory device 1600a may be implemented as a separate chip from the AP 1800, and the AP 1800 and the flash memory device 1600a may be mounted in one package. However, the example embodiments are not limited thereto, and the plurality of flash memory devices 1600a and 2600b may be electrically connected to the mobile system 1000 through a connection.

The flash memory devices 1600a and 2600b may store data such as still images/movies taken by the camera 1100, or may store data received through a communication network and/or ports included in the I/O devices 1700a and 1700b, and for example, may store Augmented Reality/Virtual Reality, High Definition (HD), or Ultra High Definition (UHD) contents.

As set forth above, according to an example embodiment, by connecting a capacitor to an output terminal of an interface circuit, and by charging or discharging a capacitor depending on an on/off operation of a first switching element and a second switching element included in an interface circuit, a slew rate of an output signal output from the interface circuit may be adjusted.

While example embodiments have been illustrated and described above, it will be apparent to those skilled in the art that modifications and variations could be made without departing from the scope as defined by the appended claims.

What is claimed is:

1. An interface circuit comprising:
a first switching element controlled by a first input signal and connected to a first power supply node configured to supply a first power supply voltage, and an output node configured to output an output signal;
a second switching element controlled by a second input signal different from the first input signal, and connected to the output node and a second power supply node configured to supply a second power supply voltage lower than the first power supply voltage;
a first resistor connected between the first power supply node and the first switching element;
a second resistor connected between the second power supply node and the second switching element;
a first capacitor connected to the output node and controlled by a first control signal;
a second capacitor connected to the output node, and controlled by a second control signal different from the first control signal;
a third capacitor connected to a node between the first resistor and the first switching element; and
a fourth capacitor connected to a node between the second resistor and the second switching element.

2. The interface circuit of claim 1, wherein the first control signal is equal to the first input signal.

3. The interface circuit of claim 1, wherein the second control signal is complementary to the second input signal.

4. The interface circuit of claim 1, wherein the third capacitor is controlled by a third control signal, and the fourth capacitor is controlled by a fourth control signal.

5. The interface circuit of claim 4, wherein the third control signal and the fourth control signal are constant voltage signals, and
wherein a magnitude of the third control signal is equal to a magnitude of the fourth control signal.

6. The interface circuit of claim 4, wherein the third control signal is a first constant voltage signal,
wherein the fourth control signal is a second constant voltage signal, and
wherein a magnitude of the second constant voltage signal is different from a magnitude of the first constant voltage signal.

7. The interface circuit of claim 4, wherein the third control signal is equal to the first control signal, and
wherein the fourth control signal is equal to the second control signal.

8. The interface circuit of claim 1, wherein the third capacitor comprises a parasitic capacitor included in the first switching element.

9. The interface circuit of claim 1, wherein a magnitude of the output signal comprises one of a first level, a second level greater than the first level, or a third level greater than the second level.

10. The interface circuit of claim 9, wherein based on the magnitude of the output signal increasing from the first level to the second level, the second capacitor is charged,
wherein based on the magnitude of the output signal increasing from the second level to the third level, the first capacitor is charged, and
wherein based on the magnitude of the output signal increasing from the first level to the third level, the first capacitor and the second capacitor are charged simultaneously.

11. The interface circuit of claim 9, wherein based on the magnitude of the output signal decreasing from the third level to the second level, the first capacitor is discharged,
wherein based on the magnitude of the output signal decreasing from the second level to the first level, the second capacitor is discharged, and
wherein based on the magnitude of the output signal decreasing from the third level to the first level, the first capacitor and the second capacitor are simultaneously discharged.

12. The interface circuit of claim 1, wherein a magnitude of the output signal comprises one of a first level, and a second level greater than the first level.

13. The interface circuit of claim 12, wherein based on the magnitude of the output signal increasing from the first level to the second level, the first capacitor is charged, and
wherein based on the magnitude of the output signal decreasing from the second level to the first level, the second capacitor is discharged.

14. An interface device comprising:
a plurality of interface circuits, wherein each interface circuit of the plurality of interface circuits includes a first switching element connected in series to a second switching element, and a first capacitor and a second capacitor connected to an output terminal to which the first switching element and the second switching element are connected; and
a controller configured to determine a plurality of output signals corresponding to the plurality of interface circuits by controlling the first switching element and the second switching element, configured to adjust a slew rate of the plurality of output signals by charging and discharging the first capacitor and the second capacitor, and configured to input a first input signal to a control terminal of the first switching element and to the first capacitor.

15. The interface device of claim 14, wherein based on the plurality of output signals being differential signals, the controller is further configured to input the first input signal to the second capacitor.

16. The interface device of claim 14, wherein based on the plurality of output signals being multi-level signals, the controller is further configured to input a second input signal to a control terminal of the second switching element, and to input a complementary signal of the second input signal to the second capacitor.

17. The interface device of claim 14, wherein a capacitance of the first capacitor is equal to a capacitance of the second capacitor.

18. An interface circuit comprising:
a first switching element configured to receive a first power supply voltage and to be turned on and turned off by a first input signal;
a second switching element configured to receive a second power supply voltage lower than the first power supply voltage, and to be turned on and turned off by a second input signal different from the first input signal;
a first capacitor, wherein a first terminal of the first capacitor is connected to an output node to which the first switching element and the second switching element are connected, and a second terminal of the first capacitor is configured to receive a first control signal; and
a second capacitor, wherein a first terminal of the second capacitor is connected to the output node and a second terminal of the second capacitor is configured to receive a second control signal different from the first control signal,
wherein based on an output signal output from the output node increasing, at least one of the first control signal and the second control signal increases from a low level to a high level, and
wherein based on the output signal decreasing, the at least one of the first control signal and the second control signal decreases from the high level to the low level.

19. The interface circuit of claim 18, wherein, based on an amount of change of a magnitude of the output signal being a first value, only one of the first control signal and the second control signal is changed, and
wherein based on the amount of change of the magnitude of the output signal being a second value greater than the first value, the first control signal and the second control signal are changed simultaneously.

20. The interface circuit of claim 18, wherein the first control signal is equal to the first input signal, and the second control signal is complementary to the second input signal.

* * * * *